United States Patent
Sato et al.

(10) Patent No.: US 9,691,842 B2
(45) Date of Patent: Jun. 27, 2017

(54) SEMICONDUCTOR DEVICE AND METHOD OF MANUFACTURING SEMICONDUCTOR DEVICE

(71) Applicant: KABUSHIKI KAISHA TOSHIBA, Tokyo (JP)

(72) Inventors: Shinya Sato, Nonoichi Ishikawa (JP); Tomoyuki Sakuma, Nonoichi Ishikawa (JP); Noboru Yokoyama, Kanazawa Ishikawa (JP); Shizue Matsuda, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/836,697

(22) Filed: Aug. 26, 2015

(65) Prior Publication Data

US 2016/0260797 A1  Sep. 8, 2016

(30) Foreign Application Priority Data

Mar. 5, 2015  (JP) ................. 2015-043410

(51) Int. Cl.

| H01L 21/00 | (2006.01) |
|---|---|
| H01L 29/04 | (2006.01) |
| H01L 21/02 | (2006.01) |
| H01L 21/283 | (2006.01) |
| H01L 21/306 | (2006.01) |

(Continued)

(52) U.S. Cl.
CPC ...... *H01L 29/045* (2013.01); *H01L 21/02532* (2013.01); *H01L 21/02636* (2013.01);

(Continued)

(58) Field of Classification Search
CPC .. H01L 29/045; H01L 29/66477; H01L 29/78
See application file for complete search history.

(56) References Cited

U.S. PATENT DOCUMENTS 6,495,294 B1   12/2002  Yamauchi et al.
7,714,385 B2 *  5/2010  Tokano ............... H01L 29/0634
                                              257/341

(Continued)

FOREIGN PATENT DOCUMENTS

| JP | 2007173734 A | 7/2007 |
| JP | 2013077854 A | 4/2013 |

OTHER PUBLICATIONS

Korean Office Action dated Jun. 28, 2016, filed in Korean counterpart Application No. 10-2015-0103669, 14 pages (with translation).

*Primary Examiner* — Laura Menz
(74) *Attorney, Agent, or Firm* — Patterson & Sheridan, LLP

(57) ABSTRACT

A semiconductor device includes first semiconductor regions of a first conductivity type spaced apart from each other and second semiconductor regions of a second conductivity type between adjacent first semiconductor regions. At least one second semiconductor region includes a void having at least one outer surface with a crystal plane orientation of (100). A third semiconductor region of the second conductivity type is on each second semiconductor region and a fourth semiconductor region of the first conductivity type is on the third semiconductor region. A gate electrode on is disposed on each first semiconductor region to be adjacent to a third semiconductor region via a gate insulation layer.

17 Claims, 20 Drawing Sheets

(51) Int. Cl.
*H01L 21/31* (2006.01)
*H01L 21/311* (2006.01)
*H01L 21/324* (2006.01)
*H01L 29/06* (2006.01)
*H01L 29/66* (2006.01)
*H01L 29/78* (2006.01)
*H01L 21/308* (2006.01)
*H01L 21/225* (2006.01)

(52) U.S. Cl.
CPC ........ *H01L 21/283* (2013.01); *H01L 21/3083* (2013.01); *H01L 21/30604* (2013.01); *H01L 21/31* (2013.01); *H01L 21/31111* (2013.01); *H01L 21/324* (2013.01); *H01L 21/3247* (2013.01); *H01L 29/0634* (2013.01); *H01L 29/0684* (2013.01); *H01L 29/66477* (2013.01); *H01L 29/78* (2013.01); *H01L 21/2257* (2013.01)

(56) References Cited

U.S. PATENT DOCUMENTS

| | | | |
|---|---|---|---|
| 8,097,501 | B2 | 1/2012 | Sakuma et al. |
| 2006/0255390 | A1 | 11/2006 | Matsumoto et al. |
| 2007/0148931 | A1* | 6/2007 | Tokano ............... H01L 29/0634 438/561 |
| 2008/0283912 | A1* | 11/2008 | Shibata ............... H01L 29/0634 257/341 |
| 2010/0197088 | A1* | 8/2010 | Sakuma ............... H01L 29/7802 438/198 |
| 2012/0273916 | A1 | 11/2012 | Yedinak et al. |
| 2014/0346593 | A1* | 11/2014 | Hsieh ............... H01L 29/7813 257/334 |
| 2015/0076589 | A1* | 3/2015 | Sato ................ H01L 29/7802 257/329 |
| 2016/0163789 | A1* | 6/2016 | Hsieh ............... H01L 29/4916 257/330 |

* cited by examiner

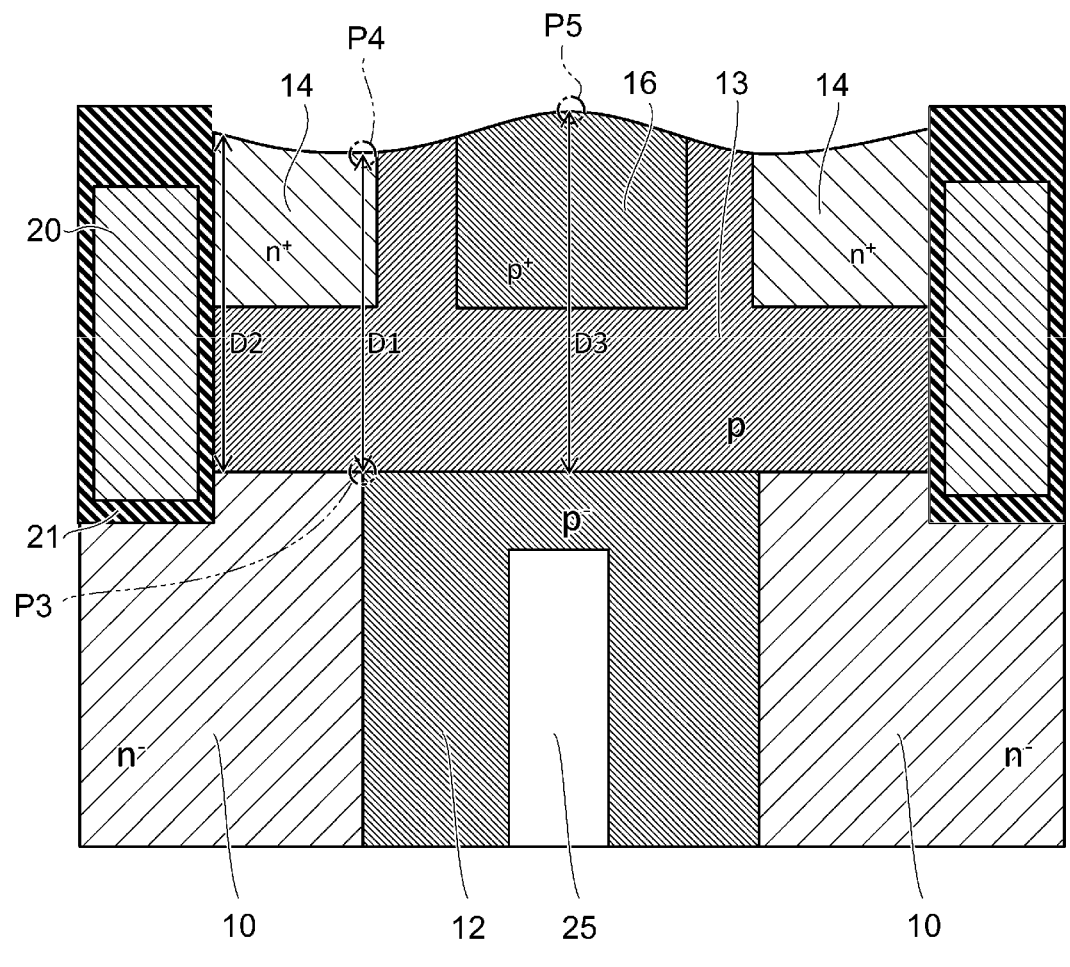
FIG. 13
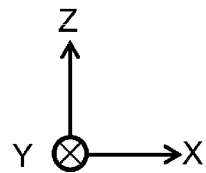

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2015-043410, filed on Mar. 5, 2015, the entire contents of which are incorporated herein by reference.

FIELD

Embodiments described herein relate generally to a semiconductor device and a method of manufacturing a semiconductor device.

BACKGROUND

A semiconductor device such as a metal oxide semiconductor field effect transistor (MOSFET) may have a super junction structure to improve a breakdown voltage. A super junction structure can be formed by forming a plurality of openings in an n type semiconductor layer and then forming p type semiconductor layers in these openings. These p type semiconductor layers formed in the openings may include voids—that is, the openings may be incompletely filled with p type semiconductor materials. When the p type semiconductor layers formed in the openings have voids, the reliability of the semiconductor device is degraded and device manufacturing yield may be reduced.

DESCRIPTION OF THE DRAWINGS

FIGS. 4A and 4B to FIGS. 11A and 11B are cross sectional views illustrating a method of manufacturing a semiconductor device according to the first embodiment.

FIG. 13 is an enlarged sectional view illustrating a part of a semiconductor device according to a second embodiment.

FIGS. 14A and 14B to FIGS. 17A and 17B are cross sectional views illustrating a method of manufacturing a semiconductor device according to the second exemplary embodiment.

DETAILED DESCRIPTION

Figure 1:
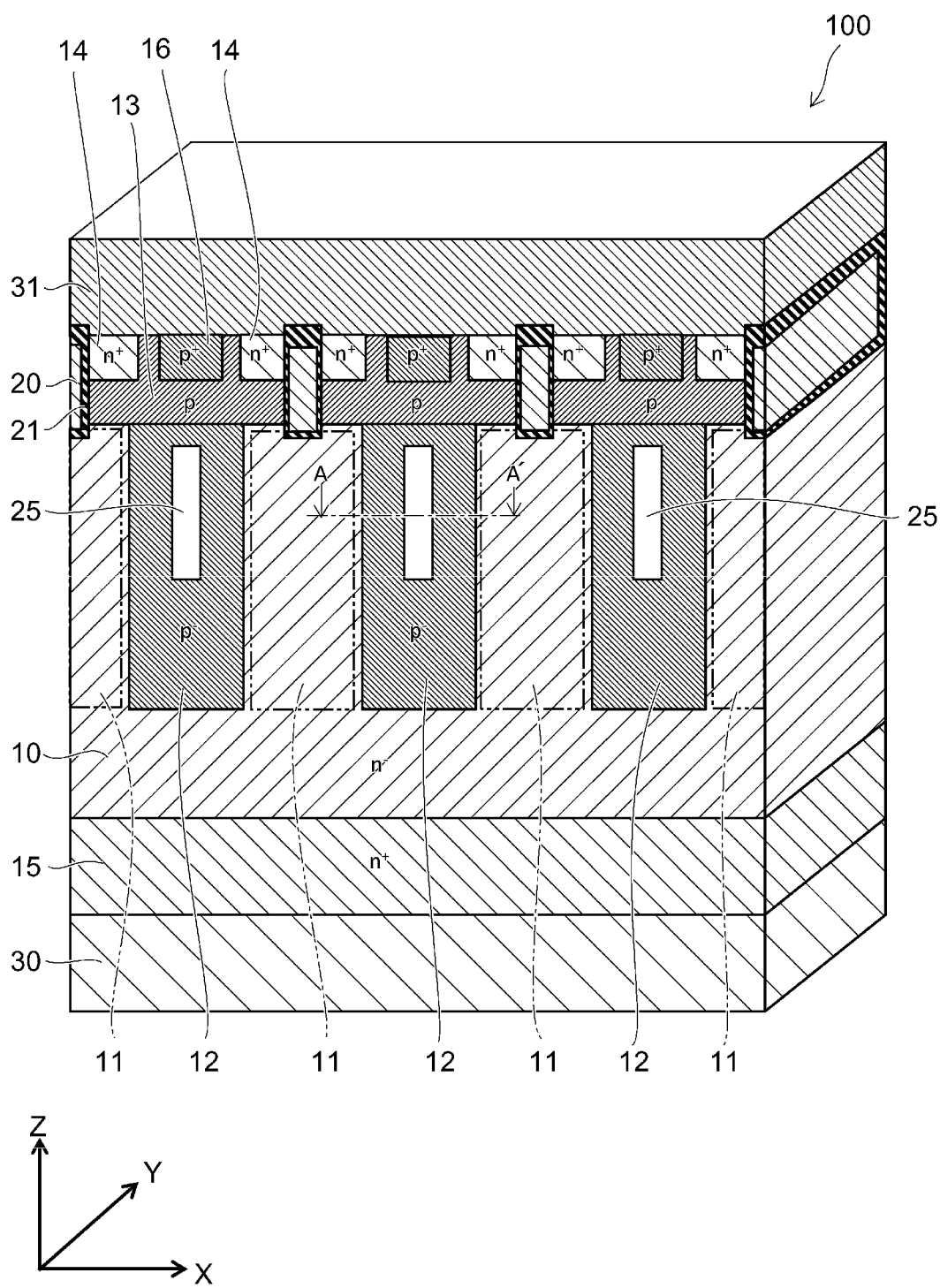
FIG. 1 is a perspective view illustrating a part of a semiconductor device according to a first embodiment.

In general, according to one embodiment, a semiconductor device is provided including a plurality of first conductive type first semiconductor regions spaced apart in a first direction and extending in a second direction intersecting the first direction. The semiconductor device further includes a plurality of second conductive type second semiconductor regions that extend in the second direction and are arranged in an alternating pattern with respect to the first semiconductor regions in the first direction. At least one of the second semiconductor regions includes a void having at least one surface with a plane orientation of (100). A plurality of second conductive type third semiconductor regions is provided on the second semiconductor regions. A plurality of first conductive type fourth semiconductor regions are selectively provided on the third semiconductor regions. The semiconductor device further includes a plurality of gate electrodes and a plurality of gate insulation layers. Each gate insulation layer is provided between one of the third semiconductor regions and one of the gate electrodes.

According to another embodiment, a semiconductor device includes a plurality of first conductive type first semiconductor regions; a plurality of second conductive type second semiconductor regions; a second conductive type third semiconductor region; a first conductive type fourth semiconductor region; a gate electrode; and a gate insulation layer. The first semiconductor regions extend in a first direction. The plurality of first semiconductor regions is provided in a second direction intersecting the first direction. The second semiconductor regions extend in the first direction. The first semiconductor regions and the second semiconductor regions are alternately provided in the second direction. At least one of the second semiconductor regions includes voids. A plane orientation of at least one surface among the surfaces on which the voids are formed is (100). The third semiconductor region is provided on the second semiconductor region. The fourth semiconductor region is selectively provided on the third semiconductor region. The gate insulation layer is provided between the third semiconductor region and the gate electrode.

Hereinafter, exemplary embodiments will be described with reference to the accompanying drawings.

The accompanying drawings are schematic and/or conceptual and the depicted relationships between the thickness and the width of each portion and the ratio of the size between these portions may be different from those in an actual device. Further, even when the same portion is illustrated in different drawings, drawings may illustrate these portions with different dimensions and ratios for purposes of clarity in explanation.

Further, in the present disclosure and respective drawings, the same elements in depicted in different drawings or included in different in exemplary embodiments are denoted by the same reference numerals and the description of these same elements may be omitted once made.

In the description below, expressions of $n^+$, n, $n^-$, $p^+$, p, and $p^-$ indicate a relative level of impurity concentration for each conductive type. That is, n type impurity concentration of $n^+$ level is relatively higher than that of $n^-$ level. Further, p type impurity concentration of $p^+$ level is relatively higher than that of p level and the p type impurity concentration of $p^-$ level is lower than that of p level.

While exemplary embodiments described below may use n type material as "a first conductive type" material and p type material as "a second conductive type" material, the respective exemplary embodiments may also be carried out by reversing the p type and the n type of respective semiconductor regions, that is, by using n type material as "a second conductive type" material and p type material as "a first conductive type" material.

First Exemplary Embodiment

A semiconductor device 100 according to a first exemplary embodiment will be described next with reference to FIGS. 1 to 3.

FIG. 1 is a perspective sectional view illustrating a part of the semiconductor device 100 according to the first exemplary embodiment.

Figure 2:
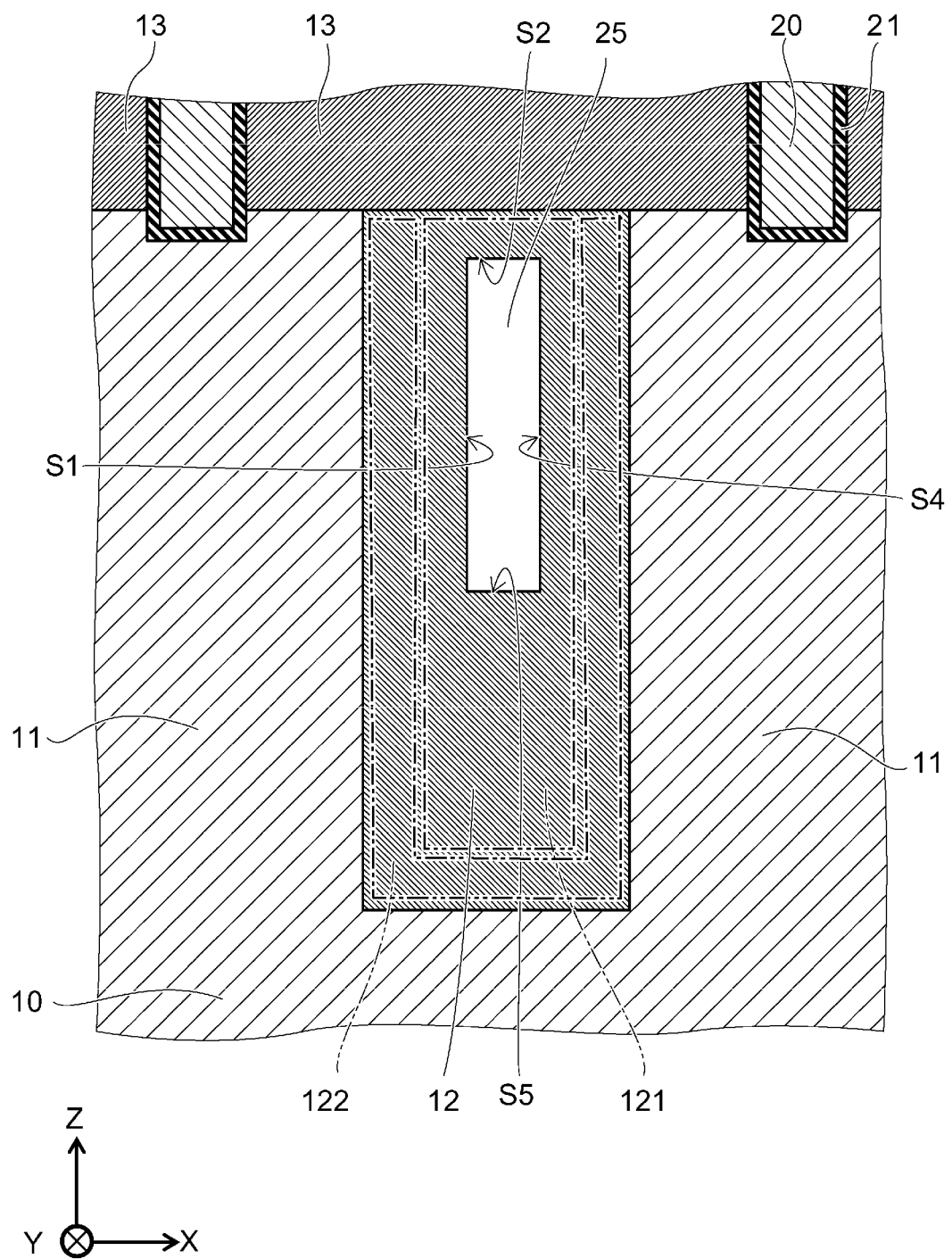
FIG. 2 is an enlarged sectional view illustrating a part of a semiconductor device according to the first embodiment.

FIG. 2 is a close-up sectional view illustrating a part of FIG. 1.

Figure 3:
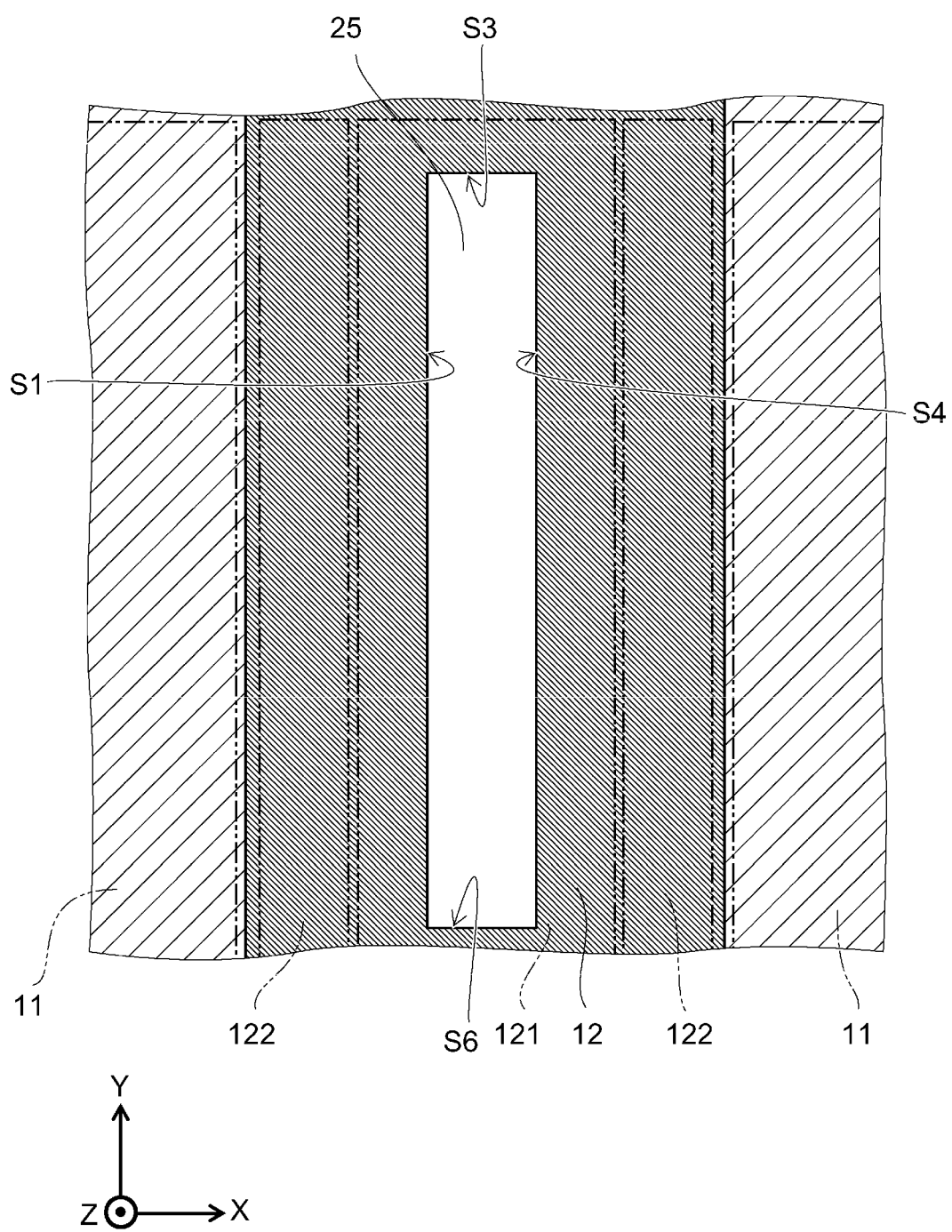
FIG. 3 is a plan view illustrating a part of the semiconductor device according to the first embodiment.

FIG. 3 is a plan view illustrating the part of the semiconductor device 100 shown in FIG. 2 according to the first exemplary embodiment.

The semiconductor device 100 according to the first exemplary embodiment is, for example, a MOSFET having a super junction structure.

The semiconductor device 100 includes an n$^+$ type drain region 15; an n$^-$ type semiconductor layer 10; a p$^-$ type semiconductor region 12 (second conductive type second semiconductor region); a p type base region 13 (third semiconductor region); an n$^+$ type source region 14 (fourth semiconductor region); a p$^+$ type contact region 16 (fifth semiconductor region); a gate electrode 20; a gate insulation layer 21; a drain electrode 30; and a source electrode 31. The n$^-$ type semiconductor layer 10 includes an n$^-$ type semiconductor region 11 (first conductive type first semiconductor region).

The n$^+$ type drain region 15 is electrically connected to the drain electrode 30. The n$^-$ type semiconductor layer 10 is provided on the n$^+$ type drain region 15.

The n$^-$ type semiconductor layer 10 includes the n$^-$ type semiconductor region 11. A plurality of the n$^-$ type semiconductor regions 11 are spaced apart in a first direction. The first direction is, for example, the X direction illustrated in FIG. 1. The n$^-$ type semiconductor region 11 extends in a second direction intersecting the first direction. The second direction is, for example, the Y direction illustrated in FIG. 1. In the example illustrated in FIG. 1, the first direction and the second direction are perpendicular to each other.

A plurality of the p$^-$ type semiconductor regions 12 are spaced apart in the X direction and the respective p$^-$ type semiconductor regions 12 extend in the Y direction. The p$^-$ type semiconductor regions 12 are provided between n$^-$ type semiconductor regions 11 adjacent to each other in the X direction. A super junction structure is formed by the n$^-$ type semiconductor regions 11 and the p$^-$ type semiconductor regions 12.

The p type base region 13 is provided above (Z direction in FIG. 1) the p$^-$ type semiconductor regions 12 and the n$^-$ type semiconductor regions 11. A portion of the p type base region 13 are spaced apart from each other, for example, in the X direction and these portions of the p type base region 13 are respectively provided above each p$^-$ type semiconductor region 12.

The p$^-$ type semiconductor regions 12 include voids 25. That is, voids 25 are provided in p$^-$ type semiconductor regions 12. A plurality of the voids 25 are spaced apart in the X direction such that in the exemplary embodiment depicted one void 25 is in each p$^-$ type semiconductor regions 12. Here, the p$^-$ type semiconductor regions 12 include the voids 25; however, in some embodiments, the p type base regions 13 may also include voids 25. For example, a first portion of a void 25 may be in a p$^-$ type semiconductor region 12 and a second portion of the void 25 may be in a p type base region 13 above that p$^-$ type semiconductor region 12.

The n$^+$ type source region 14 is selectively provided on the p type base region 13. As illustrated in FIG. 1, the p$^+$ type contact region 16 may also be selectively provided on the p type base region 13. Portions of the p type base region 13 may also be provided between a n$^+$ type source region 14 and a p$^+$ type contact region 16. As an example, at least a part of the p$^+$ type contact region 16 may be directly above the void 25 along a third direction towards the source electrode 31. Here, the third direction is the Z direction illustrated in FIG. 1. In the example illustrated in FIG. 1, the third direction is perpendicular to the first direction and the second direction. A carrier concentration of the second conductive type in the p$^+$ type contact region 16 is higher than a carrier concentration of the second conductive type in the p type base region 13.

The gate electrode 20 is provided on the n$^-$ type semiconductor region 11. A plurality of the gate electrodes 20 are spaced apart in the X direction and the respective gate electrodes 20 extend in the Y direction. The gate electrodes 20 are positioned between the p type base regions 13 adjacent to each other in the X direction. Furthermore, a plurality of the n$^+$ type source regions 14 is provided between the gate electrodes 20. A n$^+$ type source region 14 is provided on each side of each gate electrode 20 in the X direction. The p$^+$ type contact region 16 is provided between n$^+$ type source regions 14 such that the p$^+$ type contact region 16 is between adjacent gate electrodes 20 in the X direction.

The gate insulation layer 21 is provided at least between the gate electrode 20 and the p type base region 13. In the example illustrated in FIG. 1, the gate insulation layer 21 is provided between a part of the n$^-$ type semiconductor region 11, the p type base region 13, the n$^+$ type source region 14, and the gate electrode 20.

An insulation layer is also provided between the gate electrode 20 and the source electrode 31, and the gate electrode 20 is electrically separated from the source electrode 31.

The MOSFET enters an ON state by adding a voltage greater than or equal to a threshold value to the gate electrode 20 in a state where a positive voltage is applied to the drain electrode 30 with respect to the source electrode 31. At this time, a channel (inversion layer) is formed in a region in the vicinity of the gate insulation layer 21 of the p type base region 13.

When the MOSFET is in an OFF state and a positive potential is applied to the drain electrode 30 with respect to the potential of the source electrode 31, a depletion layer expands from a pn junction surface in which the n$^-$ type semiconductor region 11 is bonded to the p$^-$ type semiconductor region 12 to the n$^-$ type semiconductor region 11 and the p$^-$ type semiconductor region 12. Since an electric field concentration in a direction parallel to a junction surface is suppressed by the n$^-$ type semiconductor region 11 and the p$^-$ type semiconductor region 12 being depleted in the direction normal to the junction surface, a higher breakdown voltage may be obtained.

The main components of the n$^+$ type drain region 15, the n$^-$ type semiconductor layer 10, the p$^-$ type semiconductor region 12, the p type base region 13, the n$^+$ type source region 14, and the p$^+$ type contact region 16 are, for example, silicon (Si). The gate electrode 20 includes, for example, polysilicon. The gate insulation layer 21 includes, for example, silicon oxide. The drain electrode 30 and the source electrode 31 include, for example, metal materials such as aluminum, nickel, titanium, and tungsten.

FIG. 2 is an enlarged view of the vicinity of the p$^-$ type semiconductor region 12 of FIG. 1.

As illustrated in FIG. 2, the p$^-$ type semiconductor region 12 includes a first portion 121 and a second portion 122.

The first portion 121 is provided at the periphery of the void 25. In other words, here the void 25 is provided within the first portion 121. At least a part of the second portion 122 is provided between the first portion 121 and the n$^-$ type semiconductor region 11 along the X direction. In addition, the second portion 122 is provided between the first portion 121 and the n⁻ type semiconductor layer 10 in the Z direction. The p type impurity concentration in the first portion 121 is, for example, lower than the p type impurity concentration in the second portion 122.

The p⁻ type semiconductor region 12 includes, for example, a first surface S1, a second surface S2, a fourth surface S4, and a fifth surface S5 as illustrated in FIG. 2. The first surface S1 and the fourth surface S4 are surfaces intersecting the X direction. The second surface S2 and the fifth surface S5 are surfaces intersecting the Z direction. The first surface S1, the second surface S2, the fourth surface S4, and the fifth surface S5 form surfaces of the voids 25.

In the following disclosure, references made to plane orientations of (100), (010), and (001) are treated as equivalent to each other. A plane orientation of (100) may be used herein to refer to each of these orientations. A plane orientation of at least one of the first surface S1, the second surface S2, the fourth surface S4, and the fifth surface S5 is considered (001). In the example, all of the plane orientation of the first surface S1, the second surface S2, the fourth surface S4, and the fifth surface S5 are considered (001).

FIG. 3 is a plan view illustrating a part of the semiconductor device 100 in the plane that includes the A-A' line of FIG. 1.

As illustrated in FIG. 3, the voids 25 extend in the Y direction. The first surface S1 and the fourth surface S4 extend along the Y direction.

The p⁻ type semiconductor region 12 further includes, for example, a third surface S3 and a sixth surface S6. The third surface S3 and the sixth surface S6 are surfaces intersecting the Y direction. The plane orientation of the third surface S3 and the plane orientation of the sixth surface S6 are respectively (100).

Next, an example of a method of manufacturing the semiconductor device 100 according to the first exemplary embodiment will be described. FIGS. 4A to 11B are process sectional views illustrating a process of manufacturing the semiconductor device 100.

First, an n⁺ type semiconductor substrate (hereinafter, referred to as a substrate) 15a is prepared. The main component of the substrate 15a is, for example, silicon (Si). The substrate 15a contains n type impurities. As the n type impurities, arsenic or phosphorus may be used, for example.

Figure 4A:
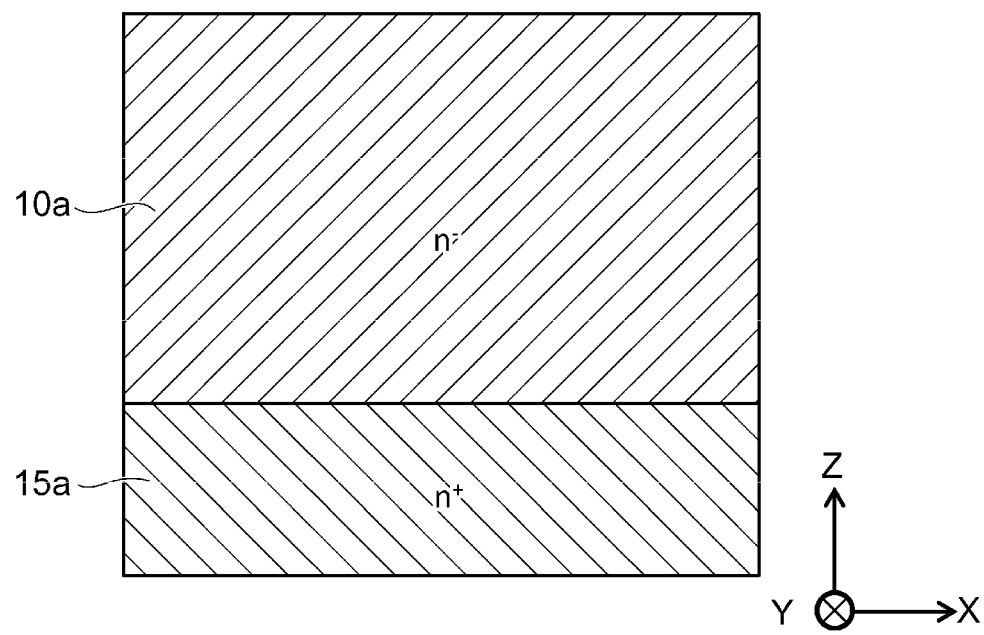

Then, as illustrated in FIG. 4A, an n⁻ type semiconductor layer 10a is formed through epitaxial growth of n-doped Si onto the substrate 15a. The n⁻ type semiconductor layer 10a is formed, for example, using a chemical vapor deposition method (CVD). As gas used to form the n⁻ type semiconductor layer 10a is, for example, a silane-based gas such as SiH₂Cl₂ or HSiCl₃.

Then, a mask M1 (see FIG. 4B) is formed on the n⁻ type semiconductor layer 10a. The mask M1 can be formed by forming a silicon oxide layer by thermally oxidizing the surface of the n⁻ type semiconductor layer 10a, and then patterning the silicon oxide layer.

Figure 4B:
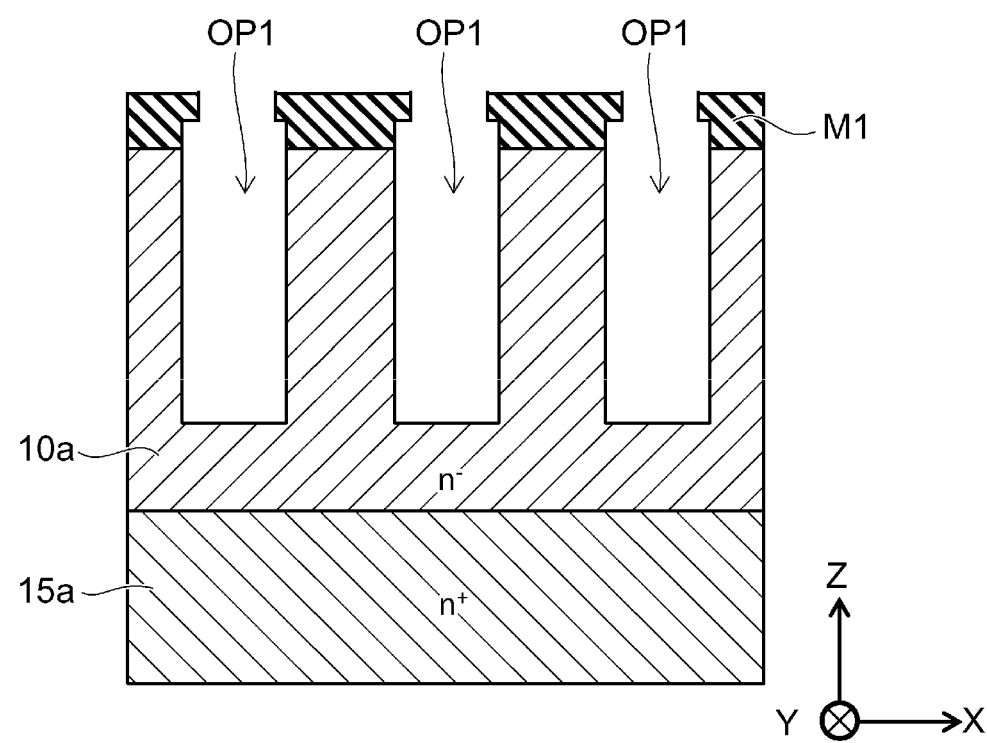

Subsequently, as illustrated in FIG. 4B, a plurality of openings OP1 are formed in the n⁻ type semiconductor layer 10a using the mask M1. The openings OP1 are spaced apart from each other in the X direction, and the respective openings OP1 extend in the Y direction. At this time, the plane orientation of a side wall of the opening OP1 is (100).

The openings OP1 are formed using a photolithography method and a reactive ion etching method (RIE), for example. After each opening OP1 is formed, a damage layer generated on the inner wall of the opening OP1 due to the RIE process may be removed by wet etching or chemical dry etching (CDE).

Figure 5A:
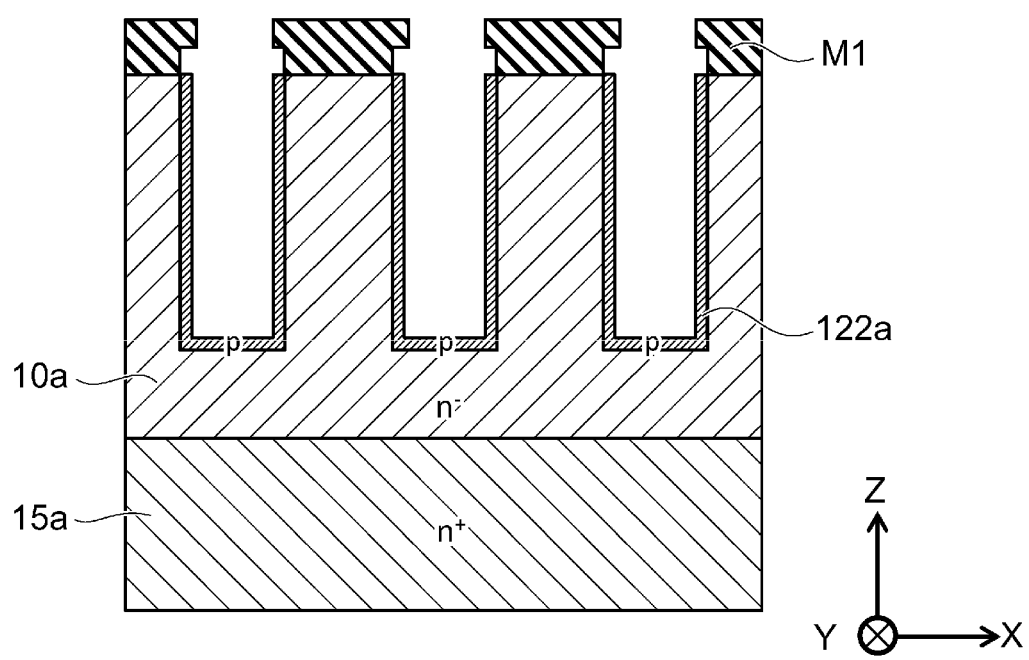

Then, as illustrated in FIG. 5A, a p type semiconductor layer 122a is formed through epitaxial growth of p-doped Si onto the inner wall of the opening OP1. The p type semiconductor layer 122a is formed along the inner wall of the opening OP1. As the p type impurities, for example, boron may be used.

Figure 5B:
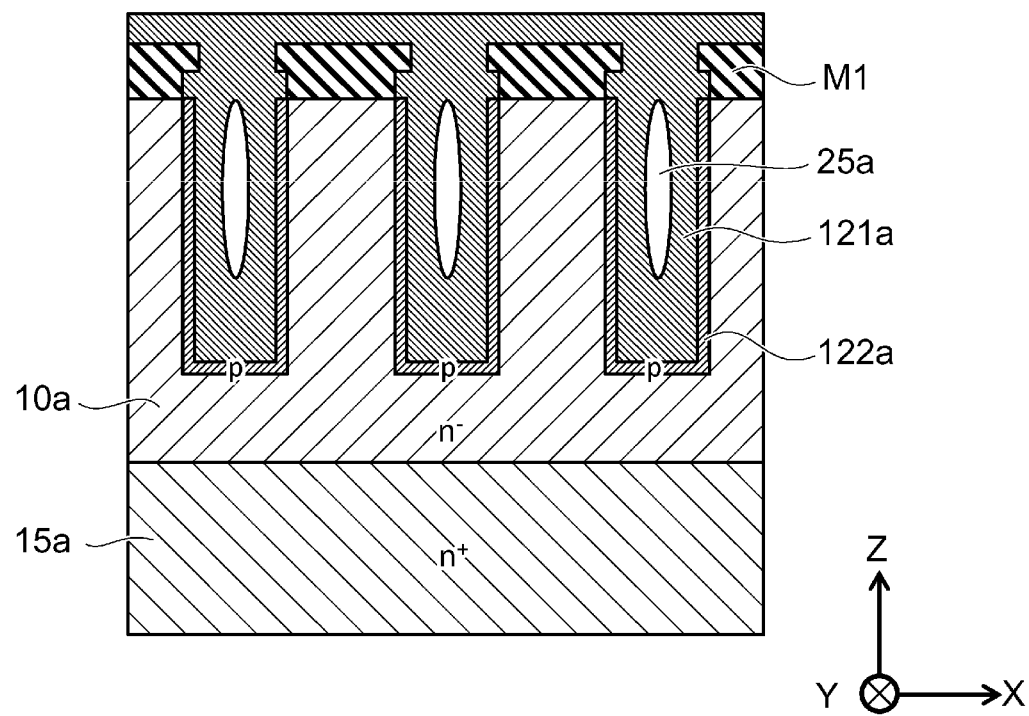

Subsequently, as illustrated in FIG. 5B, a semiconductor layer 121a is formed through epitaxial growth of Si on the p type semiconductor layer 122a. Here, the semiconductor layer 121a is formed without circulating gas containing impurities to a space in which the semiconductor layer 121a is formed. That is, semiconductor layer 121a is not intentionally doped with p-type impurities during the film deposition/formation process. Alternatively, the semiconductor layer 121a can be formed such that the p type impurity concentration in the semiconductor layer 121a is lower than the p type impurity concentration in the p type semiconductor layer 122a.

In this process, voids 25a are formed in the semiconductor layer 121a. A position of the upper end of the void 25a in the Z direction is, for example, substantially the same as a position of the lower end of the mask M1 along the Z direction.

The p type semiconductor layer 122a and the semiconductor layer 121a can be formed, for example, using the CVD method. As gas when these semiconductor layers are formed, the above-described silane-based gases may be used. At this time, it is possible to prevent Si from being deposited on the side wall of the mask M1 using chlorine-containing gases, such as HCl.

Figure 6A:
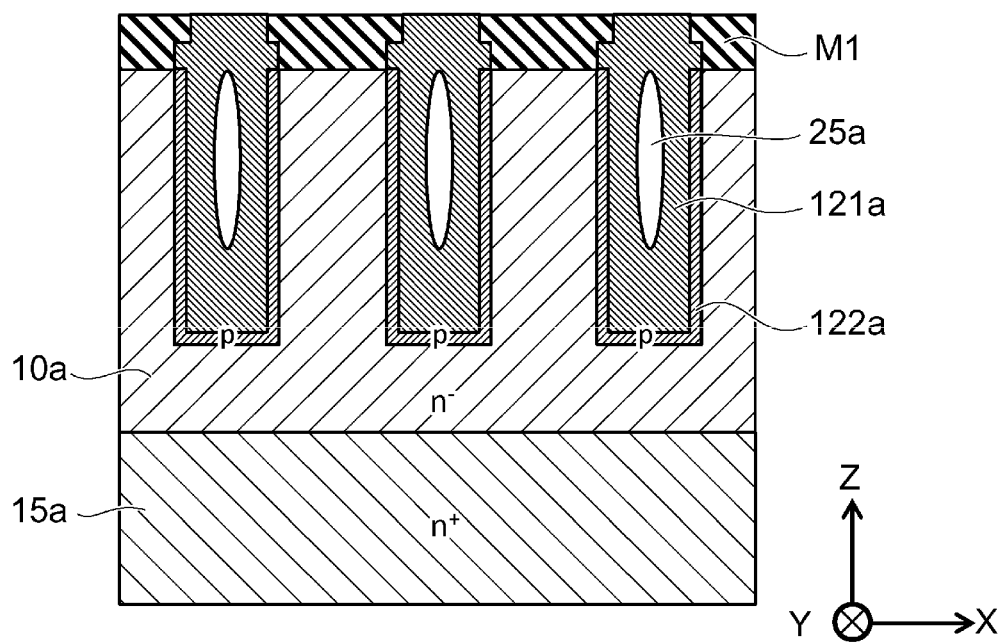
Figure 6B:
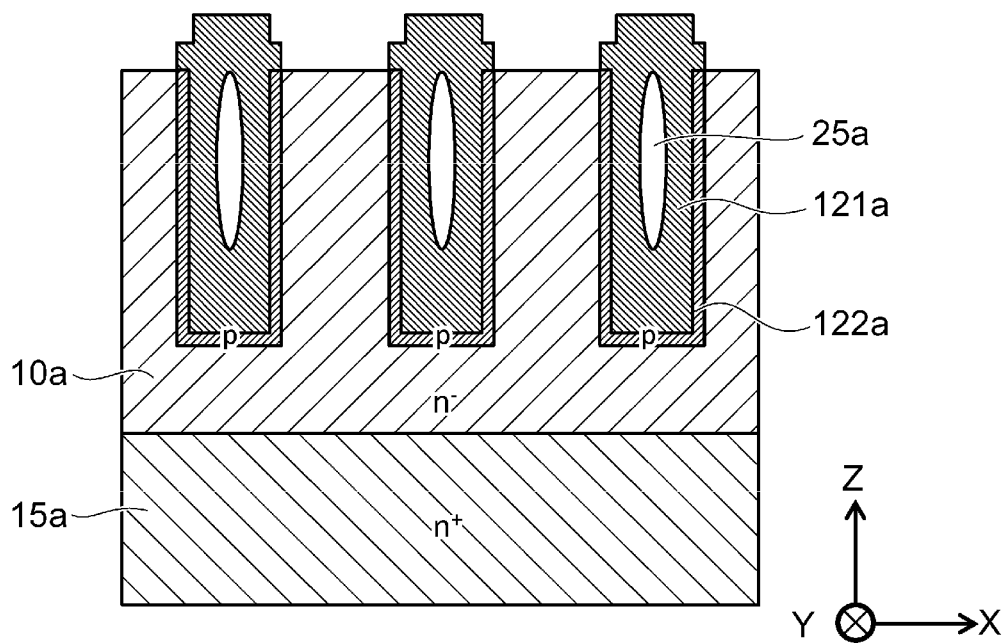

Then, as illustrated in FIG. 6A, the surface of the semiconductor layer 121a is polished, for example, using a chemical mechanical polishing method (CMP). The mask M1 is exposed by this process. Subsequently, as illustrated in FIG. 6B, the mask M1 is removed.

Then, the n⁻ type semiconductor layer 10a, the semiconductor layer 121a, and the p type semiconductor layer 122a are subjected to a heat treatment. During the heat treatment, migration of Si contained in each semiconductor layer occurs. As a result, a step height difference between the upper surface of the n⁻ type semiconductor layer 10a and the upper surface of the semiconductor layer 121a is reduced and the combined surface becomes flat.

Figure 7A:
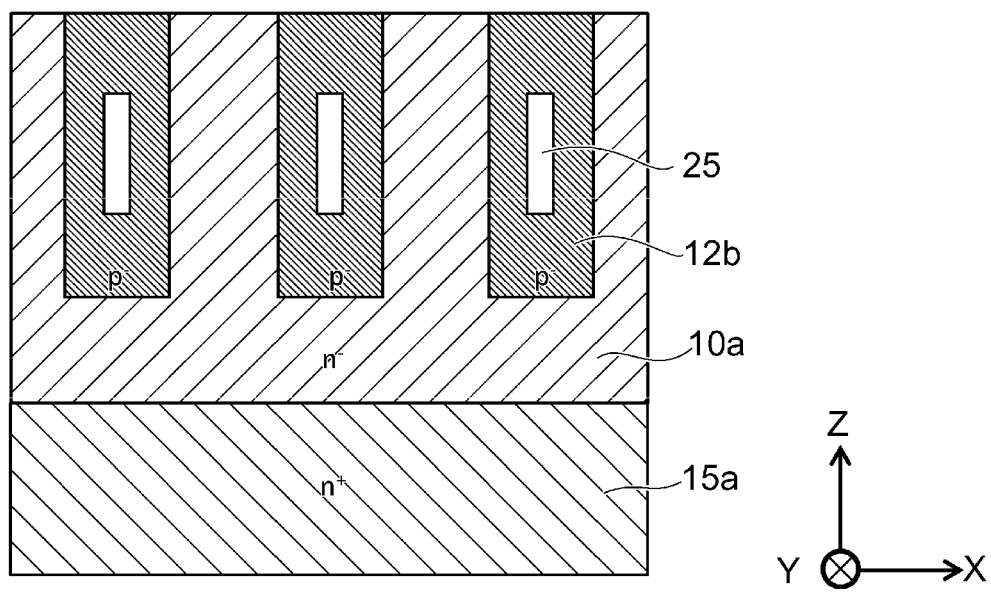

At this time, the shape of the voids 25a is changed due to migration of Si and the voids 25 illustrated in FIG. 7A are obtained. This is because a (100) surface with stabilized (lower) surface energy appears on the outer surfaces by which the voids 25a are formed due to the migration of Si during the thermal processing.

In some embodiments, the heat treatment applied to the n⁻ type semiconductor layer 10a, the semiconductor layer 121a, and the p type semiconductor layer 122a may be performed at the same time as the epitaxial growth of the Si layer on the n⁻ type semiconductor layer 10a and the semiconductor layer 121a. Alternatively, the heat treatment may be performed after the epitaxial growth of the Si layer. The distance between the upper end of the void 25 and the upper surface of the semiconductor layer may be increased through the epitaxial growth of a Si layer on the n⁻ type semiconductor layer 10a and the semiconductor layer 121a.

In this embodiment, the p type impurities are diffused into the semiconductor layer 121a from the p type semiconductor layer 122a. As a result, a p⁻ type semiconductor layer 12b having a portion corresponding to the first portion 121 and the second portion 122 illustrated in FIGS. 2 and 3 may be formed.

Figure 7B:
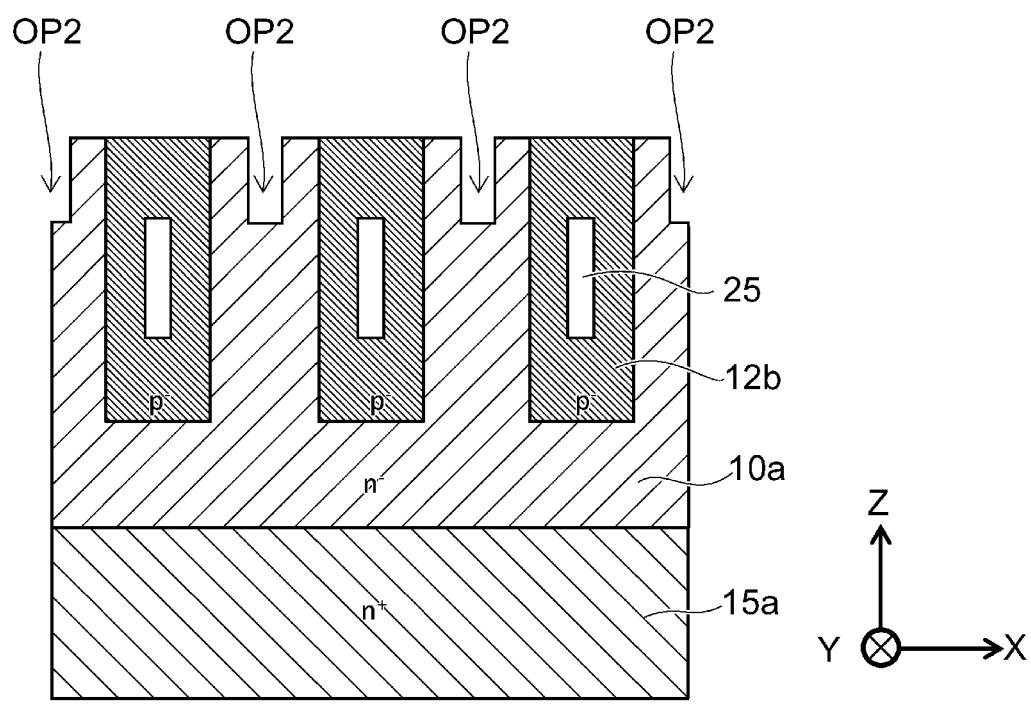

Then, a plurality openings OP2 are formed in the n⁻ type semiconductor layer 10a as illustrated in FIG. 7B. The openings OP2 are spaced apart in the X direction, and the openings OP2 extend in the Y direction.

Figure 8A:
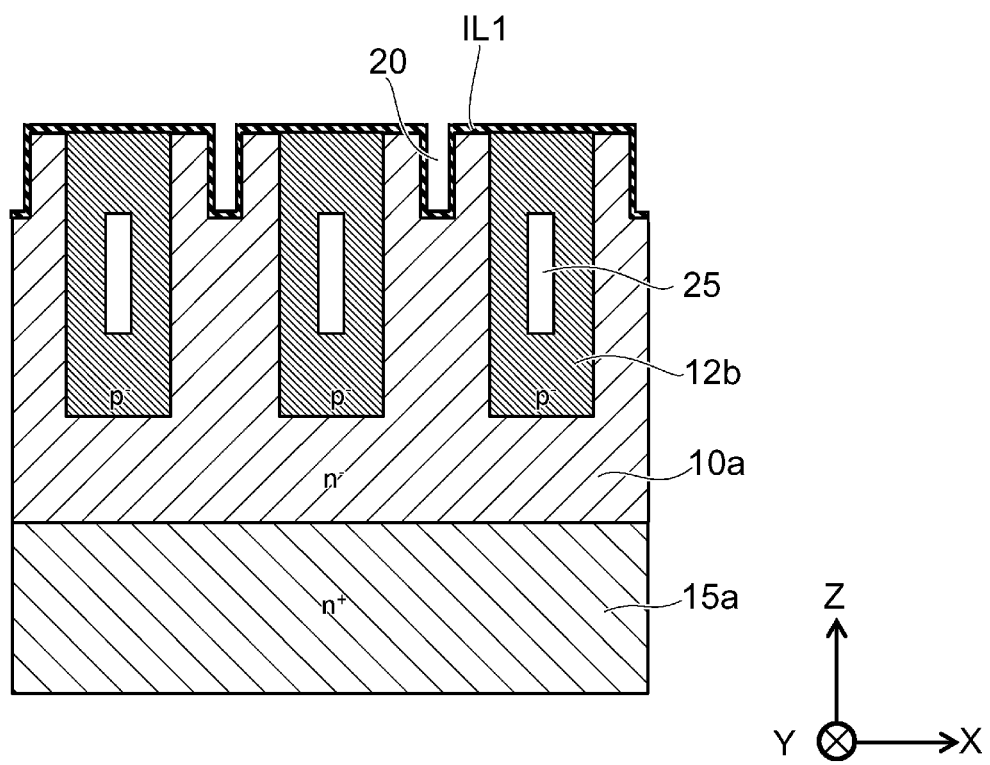

Subsequently, an insulation layer IL1 is formed on the surface of the n⁻ type semiconductor layer 10a and the surface of the p⁻ type semiconductor layer 12b as illustrated in FIG. 8A. The insulation layer IL1 contains, for example, silicon oxide and can be formed by thermally oxidizing the surface of the n⁻ type semiconductor layer 10a and the surface of the p⁻ type semiconductor layer 12b.

Figure 8B:
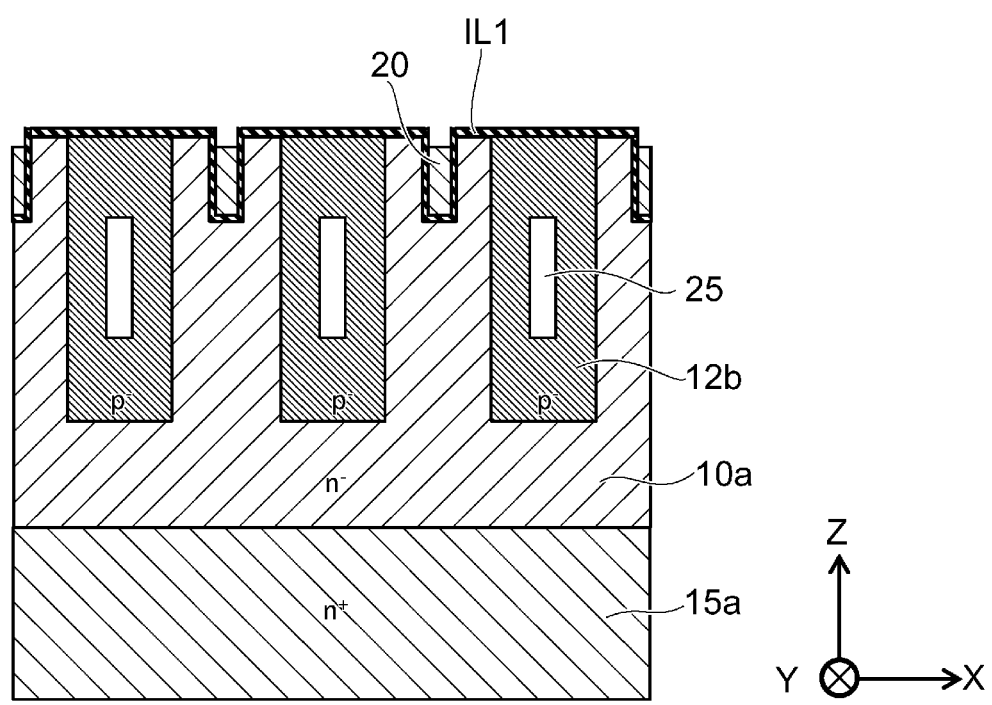

Then, a conductive layer is formed on the insulation layer IL1. The conductive layer includes, for example, polysilicon, and can be formed using a CVD method. Subsequently, the surface of the conductive layer is retreated using a wet etching method. As a result, the conductive layer is divided into plural portions as illustrated in FIG. 8B, and the gate electrodes 20 are thus formed.

Then, an insulation layer IL2 is formed on the insulation layer IL1 and the gate electrode 20. The insulation layer IL2 contains, for example, silicon oxide, and is formed using a CVD method.

Figure 9:
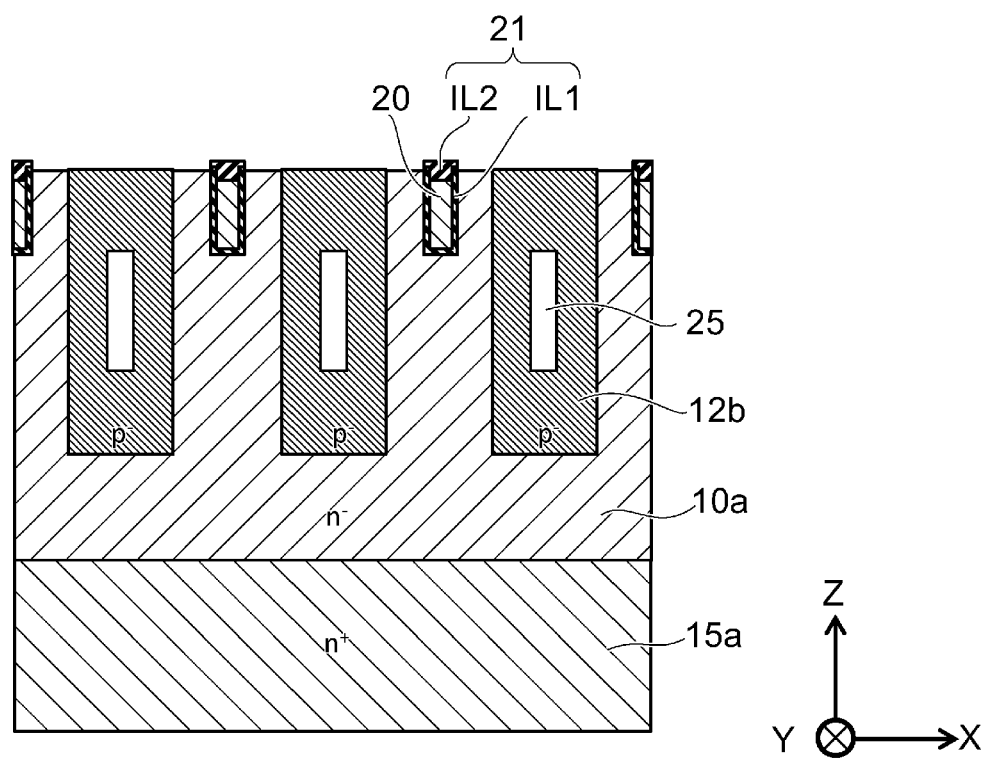

Then, as illustrated in FIG. 9, the surface of the n⁻ type semiconductor layer 10a and the surface of the p⁻ type semiconductor layer 12b are exposed by removing a part of the insulation layer IL1 and a part of the insulation layer IL2. The insulation layer IL1 and the insulation layer IL2 are divided into a plurality of layers by performing this process. The gate insulation layer 21 illustrated in FIG. 1 is comprised of the insulation layer IL1a and the insulation layer IL2a.

Figure 10A:
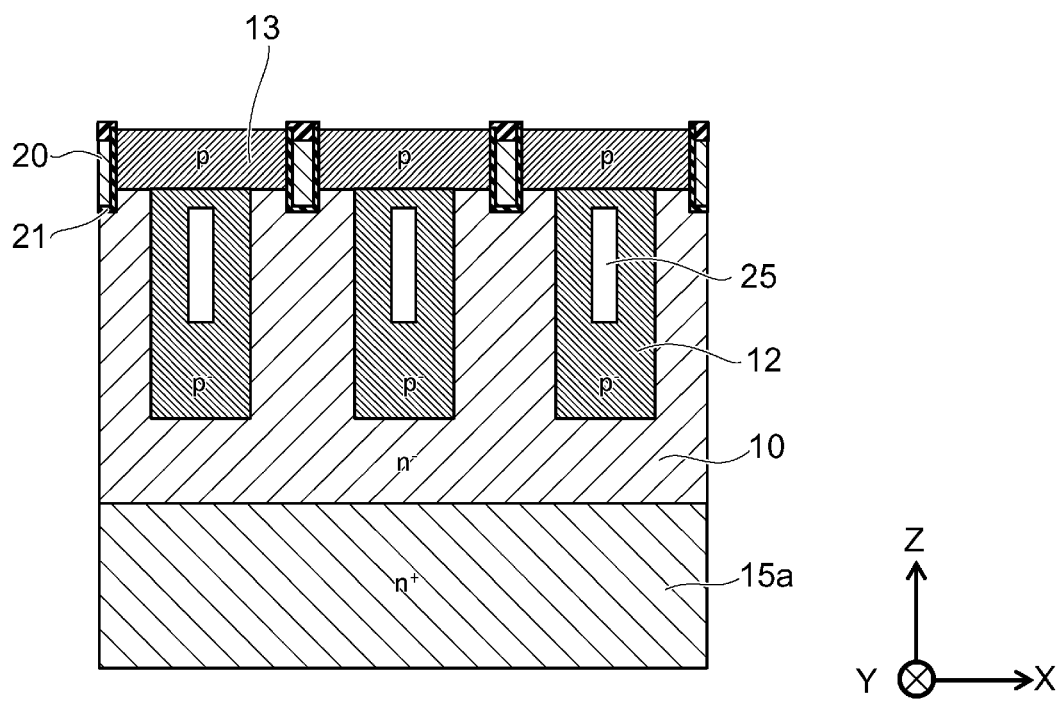

Then, as illustrated in FIG. 10A, the p type base region 13 is formed by ion-injecting p type impurities into the surface of the n⁻ type semiconductor layer 10a and the surface of the p⁻ type semiconductor layer 12b.

Figure 10B:
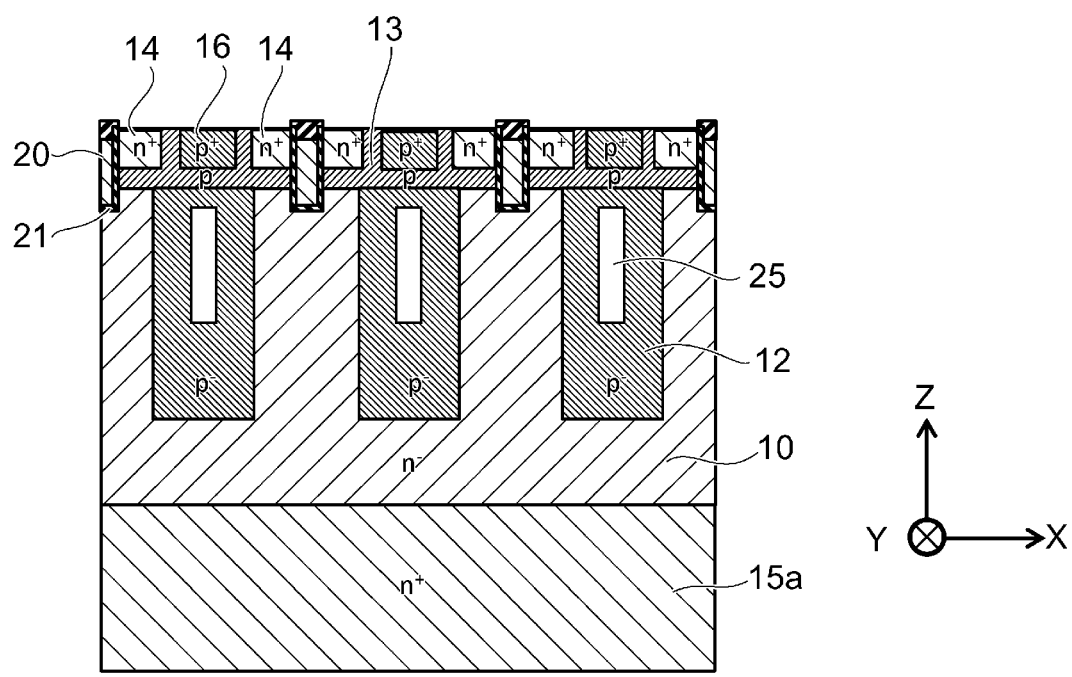

Then, the n⁺ type source regions 14 are formed by ion-injecting n type impurities into a part of the surface of the p type base region 13. Subsequently, the p⁺ type contact region 16 is formed by ion-injecting the p type impurities into another part of the surface of the p type base region 13 as illustrated in FIG. 10B.

Figure 11A:
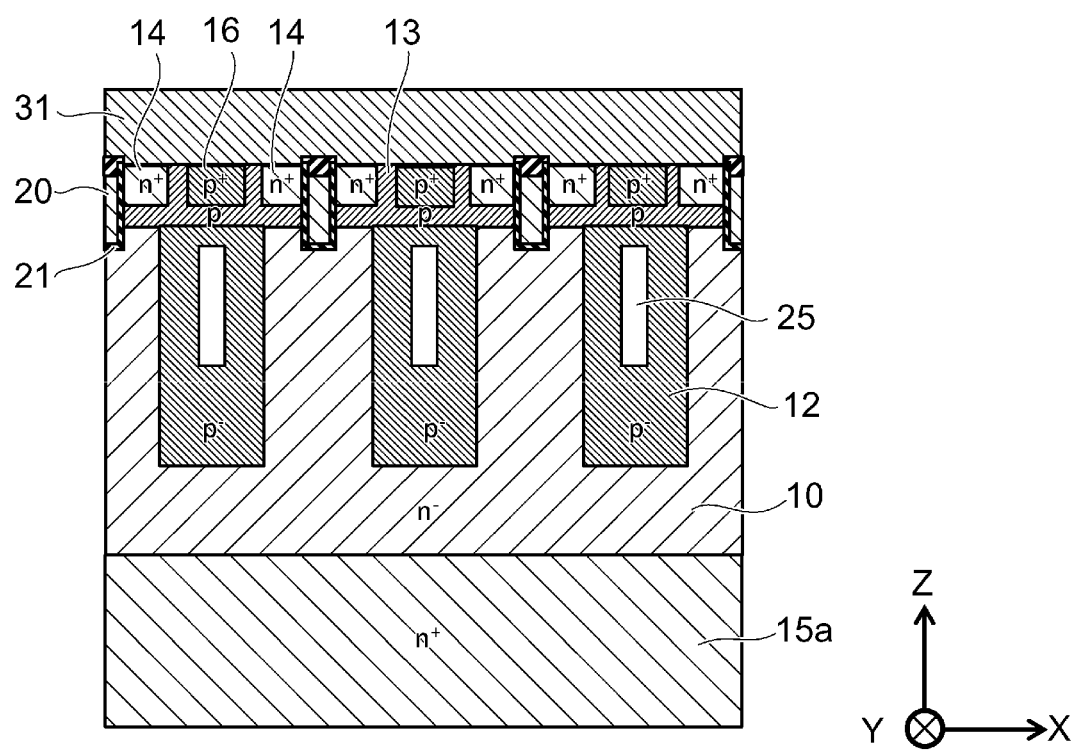

Then, as illustrated in FIG. 11A, the source electrode 31 is formed on the n⁺ type source region 14 and the p⁺ type contact region 16.

Figure 11B:
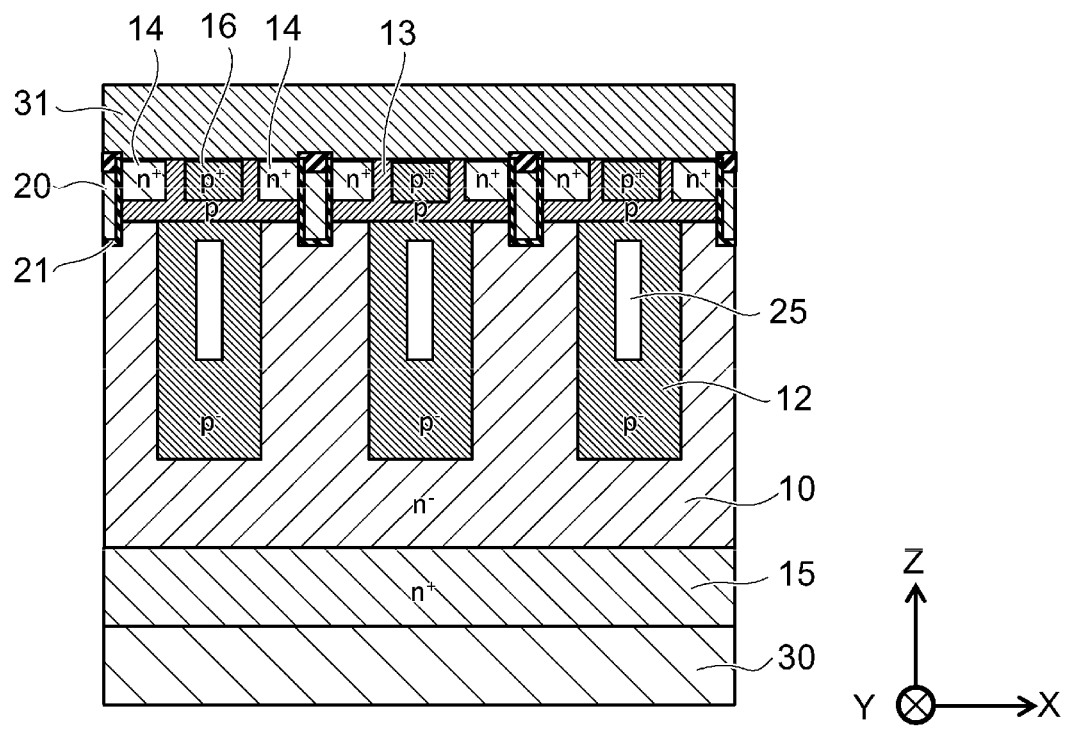

Subsequently, the rear surface of the substrate 15a is polished until the substrate 15a has a predetermined thickness. The n⁺ type drain region 15 illustrated in FIG. 1 is formed in this process. Then, as illustrated in FIG. 11B, the semiconductor device 100 is prepared by forming the drain electrode 30 on the rear surface of the substrate.

Next, the operation and the effect of the semiconductor device according to the first exemplary embodiment will be described.

In the first exemplary embodiment, the p⁻ type semiconductor region 12 includes the voids 25 and the plane orientation of at least one surface among the surfaces of the voids 25 are formed is (100). By employing such a configuration, the yield at the time of manufacturing the semiconductor device may be improved.

The reason for the improved yield is as follows.

For example, when the plane orientation of the side wall of the opening OP1 is (110), Si grows on the side wall causing a (111) surface to form. In this case, the growth rate in the vicinity of the opening end of the opening OP1 is faster than the growth rate in the vicinity of the bottom portion, and dislocation tends to occur on the upper side of the void after the opening end is blocked. When dislocation occurs, there is a possibility that a leakage current can flow in the portion in which the dislocation occurred allowing current to flow even though the MOSFET is in a nominally OFF state. This potential flaw decreases the manufacturing yield of the semiconductor device. Furthermore, in this case, the plane orientation of the surface by which the voids 25 are formed is a plane orientation other than (100).

On the other hand, when the plane orientation of the side wall of the opening OP1 is (100), Si formed on the side wall thereof grows in the vertical (normal to the surface) direction with respect to each side wall causing a (100) surface to form. Accordingly, the plane orientation of the surfaces along the side walls of the opening OP1 is (100), and material deposited on these surfaces subsequently form the voids 25. In addition, after the opening end of the opening OP1 is blocked by the Si growth from the side wall of the opening OP1, the Si crystal grows subsequently in the Z direction. For this reason, a possibility of formation of additional voids and generation of defects or dislocation on the upper portions of the voids 25 is reduced.

In addition, when the heat treatment is subsequently performed, migration of Si occurs and the plane orientation of other surfaces by which the voids 25 are formed becomes (100). At this time, the upper end position of the voids 25 becomes lower relative to positions of the p⁺ type contact region 16 the p type base region 13 because of the migration of Si. That is, the distance between the upper surface of the p⁺ type contact region 16 or the upper surface of the p type base region 13 and the upper end position of the voids 25 may be lengthened. For this reason, the possibility that the voids 25 are exposed may be reduced in a flattening process after the semiconductor layer is embedded into the opening OP1.

Accordingly, all plane orientations of the surfaces intersecting the X direction, the surfaces intersecting the Y direction, and the surfaces intersecting the Z direction among the surfaces that enclose the voids 25 are (100), and the yield at the time of manufacturing the semiconductor device having voids may be further improved.

When the voids 25 are provided in the p⁻ type semiconductor region 12, the total amount of the p type impurities in the p⁻ type semiconductor region 12 may be reduced according to the volume of the voids 25. However, according to the first exemplary embodiment, the voids 25 are provided in the first portion 121 which has a p type impurity concentration lower than the overall p type impurity concentration of the p⁻ type semiconductor region 12.

For this reason, even when the p⁻ type semiconductor region 12 includes the voids 25, the influence of the voids 25 on the total amount of the p type impurities in the p⁻ type semiconductor region 12 may be reduced. In addition, by employing such a configuration, the influence of a change in the volume of the voids 25 on the total amount of the p type impurities in the p⁻ type semiconductor region 12 may be reduced even when the volume of the voids 25 is changed or varies.

Second Exemplary Embodiment

A semiconductor device 200 according to a second exemplary embodiment will be described next with reference to FIGS. 12 and 13.

Figure 12:
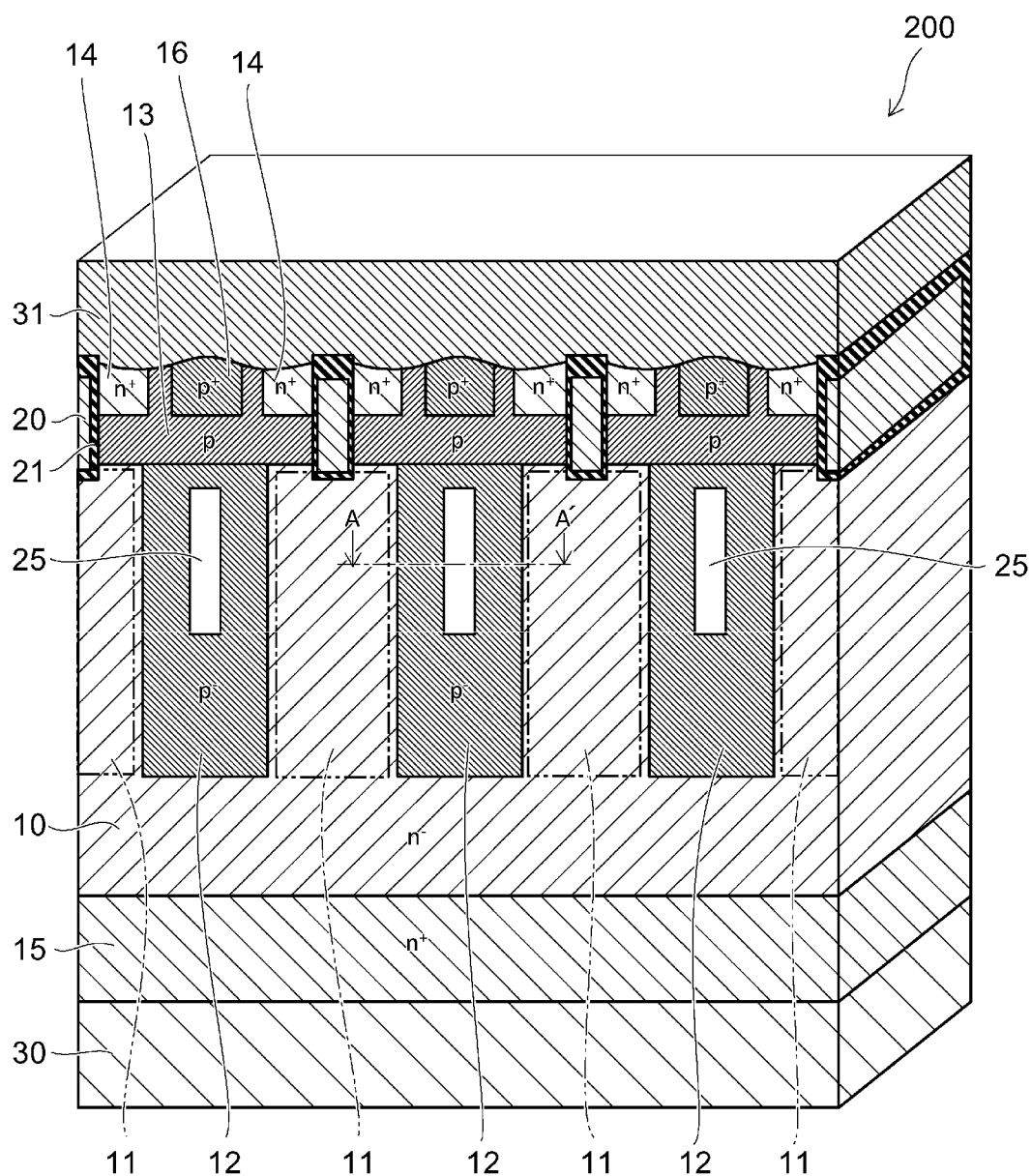
FIG. 12 is a perspective view illustrating a part of a semiconductor device according to a second embodiment.

FIG. 12 is a perspective sectional view illustrating a part of the semiconductor device 200 according to the second exemplary embodiment.

FIG. 13 is a close-up sectional view illustrating a part of FIG. 12.

In the semiconductor device 200, for example, the shapes of connection surfaces (interfaces) between the source electrode 31 and the semiconductor regions (e.g., 13, 14, and 16) are different from one another, as compared to the case of the semiconductor device 100. In regard to other features of the structure of the semiconductor device 200, for example, the same structural features as that of the semiconductor device 100 may be employed.

As illustrated in FIG. 12, for example, the position of the upper surface of the $n^+$ type source region 14 in the Z direction is different from the position on the upper surface of the $p^+$ type contact region 16 in the Z direction. Further, along the direction toward the gate insulation layer 21 from the contact region 16 (along the X direction), the height of the upper surface of the $n^+$ type source region 14 varies.

As a specific example illustrated in FIG. 13, a distance D2 is longer than a distance D1, and a distance D3 is longer than the distance D2.

The distance D1 is a distance between a third portion P3 and a fourth portion P4 in the Z direction. The third portion P3 is an upper surface of a pn junction boundary between the $n^-$ type semiconductor layer 10 and the $p^-$ type semiconductor region 12. The fourth portion P4 is a portion overlying the third portion P3 in the Z direction on the upper surface of the $n^+$ type source region 14. In this case, the fourth portion P4 may be a part of the upper surface of the p type base region 13 or a part of the upper surface of the $p^+$ type contact region 16 according to the shape or the size of the $n^+$ type source region 14 and the $p^+$ type contact region 16.

The distance D2 is a distance between a point in which the pn junction boundary between the $n^-$ type semiconductor layer 10 and the p type base region 13 is in contact with the gate insulation layer 21 and a point in which the upper surface of the $n^+$ type source region 14 is in contact with the gate insulation layer 21 in the Z direction.

The distance D3 is a distance between the position of the third portion P3 in the Z direction and a position of a fifth portion P5 in the Z direction. The fifth portion P5 is a portion overlying, in the Z direction, the center of the $p^-$ type semiconductor region 12 in the X direction on the upper surface of the $p^+$ type contact region 16. That is the $p^+$ type contact region 16 is thicker in the Z direction than the $n^+$ type source region 14 is in the Z direction. For example, when the $p^+$ type contact region 16 is not provided, the fifth portion P5 may be a part of the upper surface of the p type base region 13.

Next, an example of a method of manufacturing the semiconductor device 200 according to the second exemplary embodiment will be described.

FIGS. 14A to 17B are process sectional views illustrating the method of manufacturing the semiconductor device 200 according to the second exemplary embodiment.

Figure 14A:
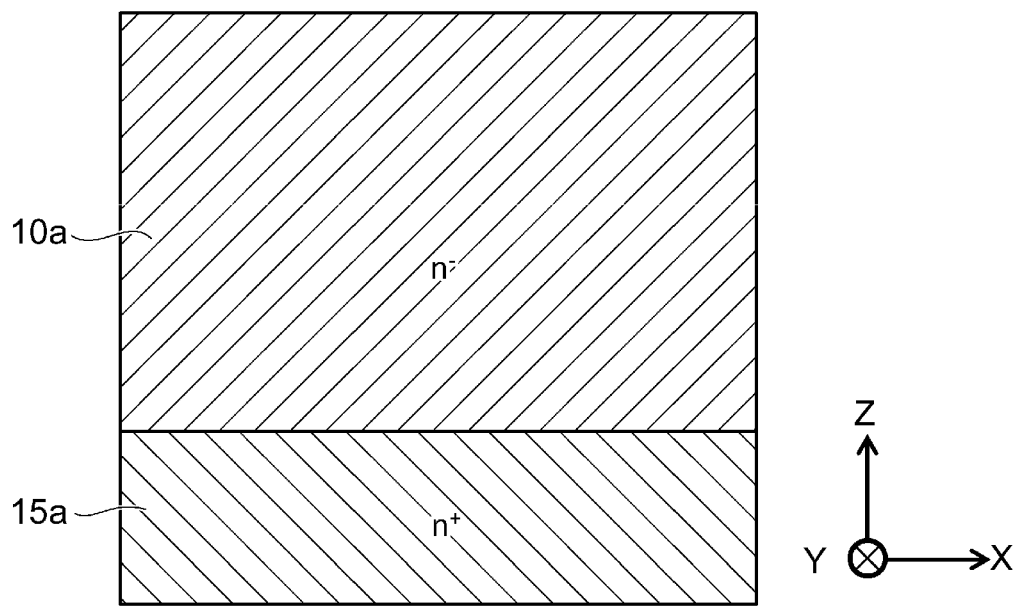

First, an $n^-$ type semiconductor layer 10a is formed on an $n^+$ type substrate 15a by epitaxial growth of n-doped Si as illustrated in FIG. 14A.

Figure 14B:
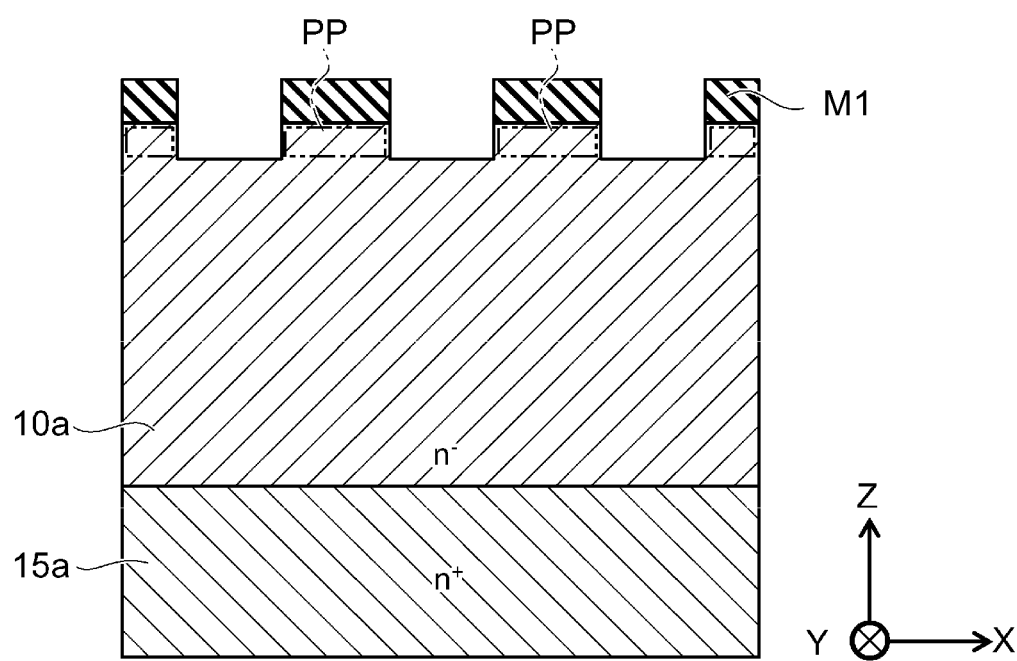

Then, a mask M1 is formed on the $n^-$ type semiconductor layer 10a. The mask M1 contains, for example, a photoresist or silicon oxide. Subsequently, as illustrated in FIG. 14B, a part of the surface of the $n^-$ type semiconductor layer 10a is removed in an etch process using the mask M1. By performing this process, a projection PP projecting in the Z direction is formed on the upper surface of the $n^-$ type semiconductor layer 10a. A plurality of the projections PP are spaced apart in the X direction, and the respective projections PP extend in the Y direction.

Figure 15A:
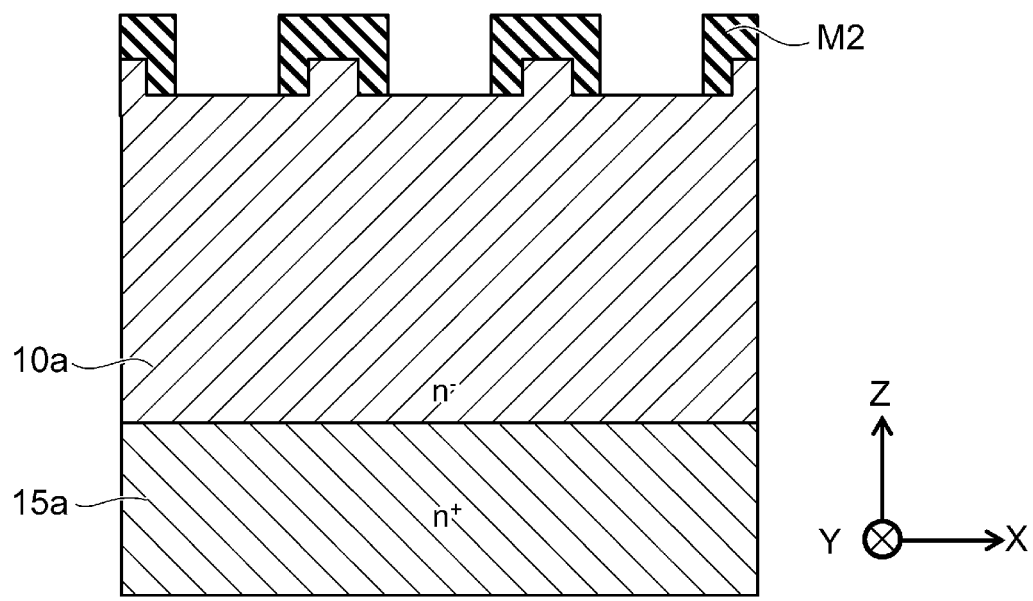

Then, a mask M2 covering the projections PP is formed as illustrated in FIG. 15A. The mask M2 covers the projections PP in a conformal manner. The projections PP are positioned between a part of the mask M2 and another part of the mask M2 in the X direction.

The mask M2 contains, for example, silicon oxide. The mask M2 forms a silicon oxide layer by thermally oxidizing the surface of the $n^-$ type semiconductor layer 10a, and then patterning the silicon oxide layer (for example, removing portions between on the surface between the projections PP).

Figure 15B:
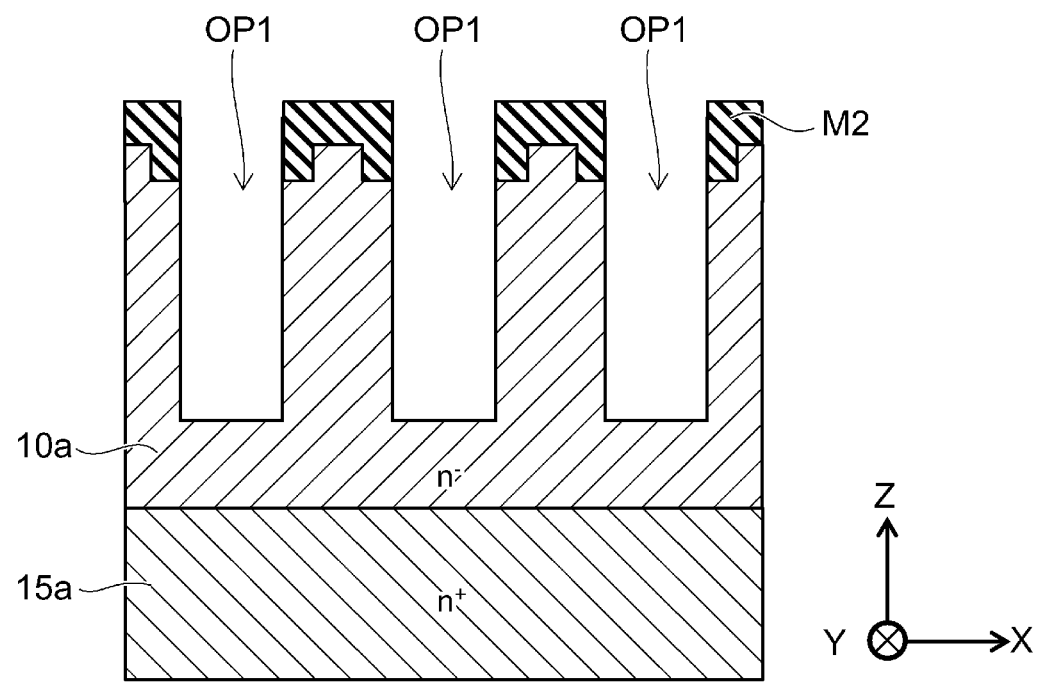

Then, as illustrated in FIG. 15B, an opening OP1 is formed in the $n^-$ type semiconductor layer 10a using the mask M2. The opening OP1 is formed, for example, using an RIE method.

Figure 16A:
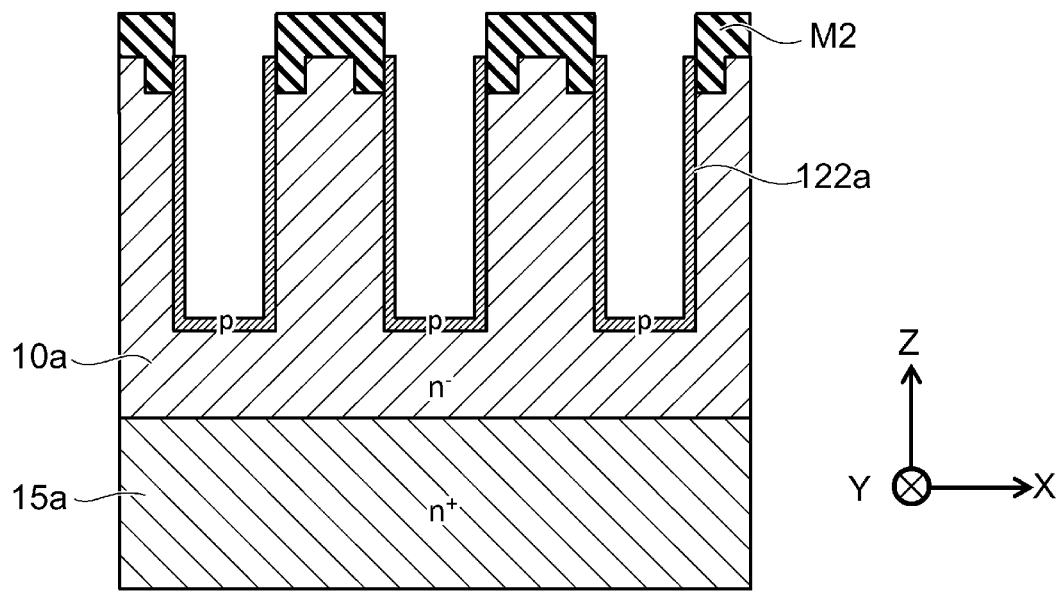

Subsequently, as illustrated in FIG. 16A, a p type semiconductor layer 122a is formed through epitaxial growth of p-doped Si onto the inner wall of the opening OP1. The p type semiconductor layer 122a is provided along the inner wall of the opening OP1.

Figure 16B:
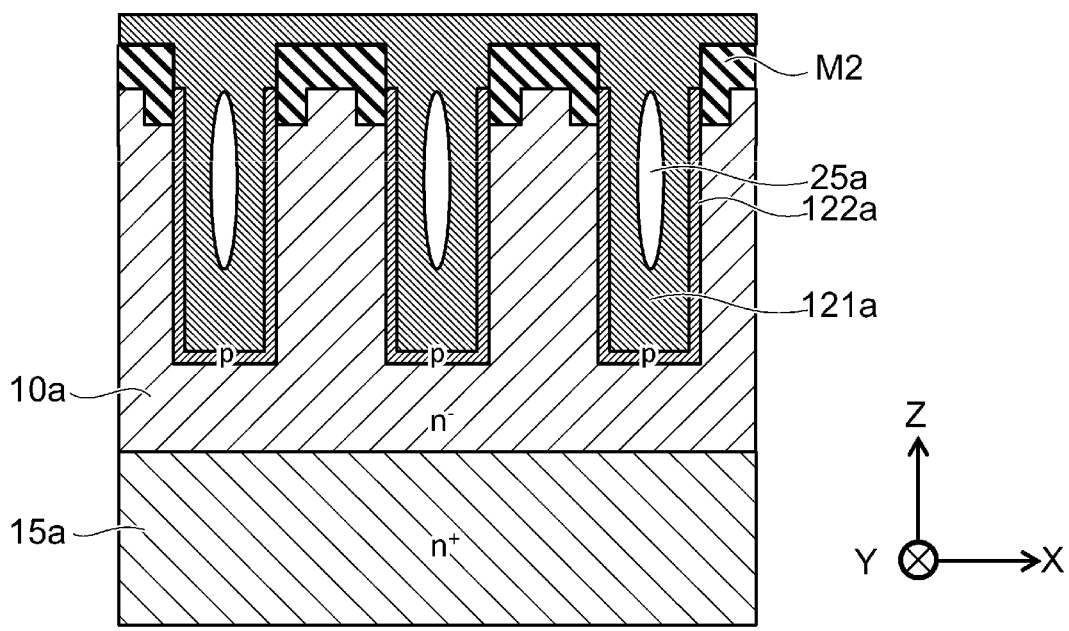

Subsequently, as illustrated in FIG. 16B, a semiconductor layer 121a is formed through epitaxial growth of Si on the p type semiconductor layer 122a. The semiconductor layer 121a can be formed, for example, without doping the p type impurities or with less impurities than the p type semiconductor layer 122a. At this time, voids 25a are formed in the semiconductor layer 121a. A position of the upper end of the void 25a is substantially the same as, for example, a position of a portion of the lower end of the mask M2 (i.e., the portion of the mask M2 that is on the remaining part of the projection PP).

Figure 17A:
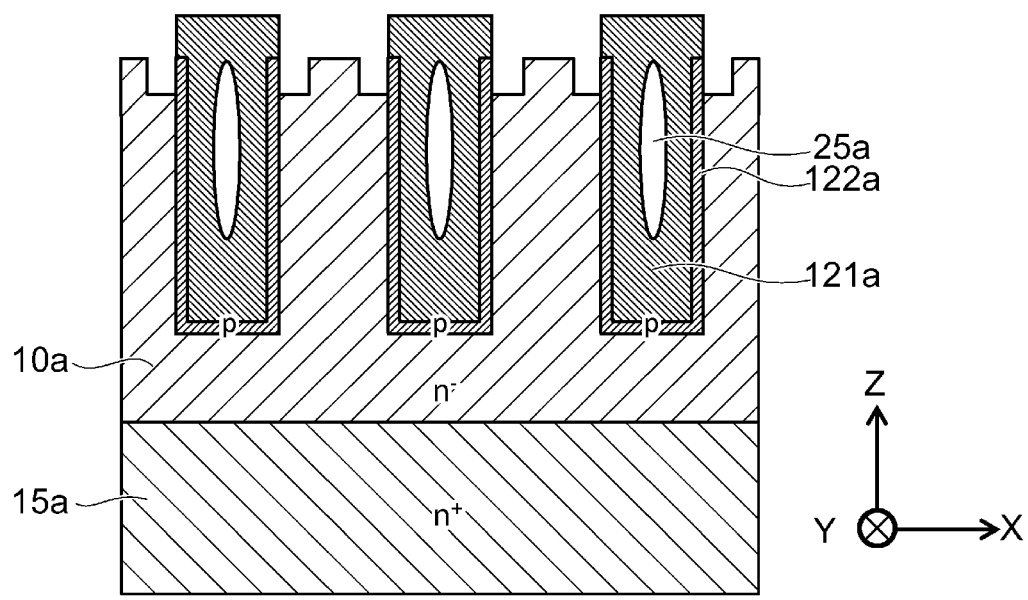

Then, the surface of the semiconductor layer 121a is flattened using, for example, a CMP method. The mask M2 is exposed by performing the process. Further, the position on the upper surface of the semiconductor layer 121a becomes equivalent to the position on the upper surface of the mask M2, for example. Subsequently, as illustrated in FIG. 17A, the mask M2 is removed.

Figure 17B:
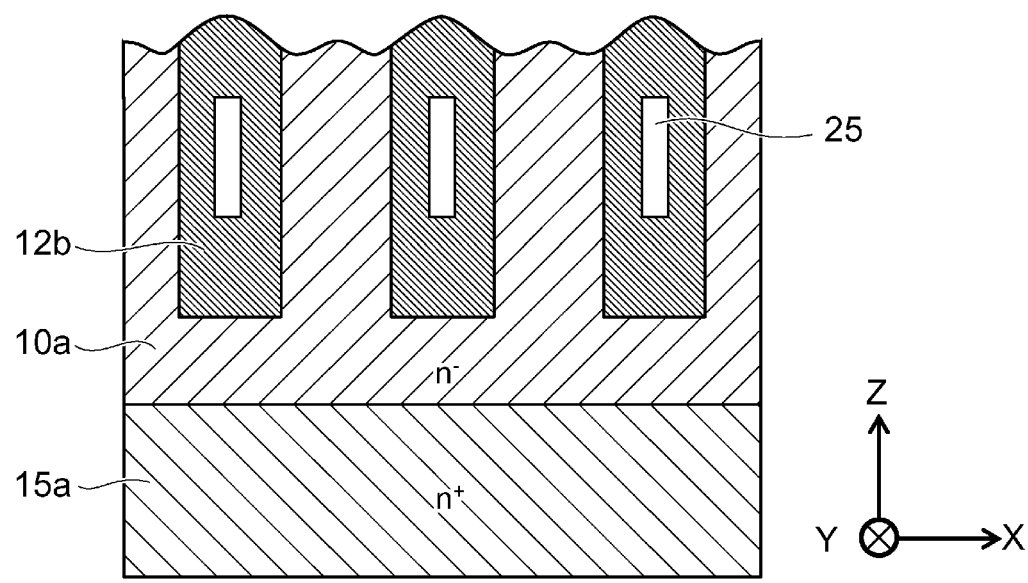

Then, the $n^-$ type semiconductor layer 10a, the semiconductor layer 121a, and the p type semiconductor layer 122a are subjected to a heat treatment. As a result, as illustrated in FIG. 17B, a step height between the upper surface of the $n^-$ type semiconductor layer 10a and the upper surface of the semiconductor layer 121a is reduced or removed and the surfaces become a continuous curved or wavy surface. Further, at the same time, the shape of the voids 25a is changed, and the voids 25 are obtained due to the migration of Si.

Then, the semiconductor device 200 is then obtained by performing processes which are substantially the same as the processes illustrated in FIGS. 7B to 11B.

In the manufacturing method according to the second exemplary embodiment, the projection PP is formed on the $n^-$ type semiconductor layer 10a, the mask M2 overlapping the projection PP is formed, and the opening OP1 is formed on the $n^-$ type semiconductor layer 10a using the mask M2. For this reason, the height of the semiconductor layer 121a after the semiconductor layer 121a is embedded into the opening OP1 and the semiconductor layer 121a is flattened may be adjusted to be higher by changing the height of the projection PP.

By employing such a method, the distance between the upper surface of the semiconductor layer 121a and the upper end of the void 25a may be increased and the possibility of the voids 25a being exposed after the semiconductor layer 121a is subjected to the heat treatment may be reduced.

Therefore, according to the second exemplary embodiment, the yield in the manufacture of the semiconductor device may be further improved.

Furthermore, when the plane orientation of the side wall of the opening OP1 is (100), Si grows in the vertical direction with respect to the side wall. For this reason, the position of the voids 25a on the upper end becomes substantially equivalent to the position of the portion of the mask M2 on the lower end (i.e., the portion of the mask M2 that is on the remaining part of the projection PP). Therefore, when the plane orientation of the side wall of the opening OP1 is (100), the distance between the upper surface of the semiconductor layer 121a and the upper end of the voids 25a may be decreased in some cases, as compared to the case where the plane orientation of the side wall of the opening OP1 is other than (100).

However, according to the second exemplary embodiment, since the distance between the upper surface of the semiconductor layer 121a and the upper end of the voids 25a may be lengthened by inclusion of projections PP, the second exemplary embodiment is particularly effective when the plane orientation of the side wall of the opening OP1 is (100) to increase device yield by reducing the possibility of voids 25 being exposed at the upper device surface.

Further, when the surface of each semiconductor layer is modified by performing the heat treatment, the distance between the surface of the p⁻ type semiconductor layer 12b and the voids 25 in the Z direction after the heat treatment, as shown in FIG. 17B, depends on the volume of the semiconductor layer formed above the lower end of the mask M2. The volume of the semiconductor layer above the lower end of the mask M2 may be increased by forming the projection PP and forming the mask M2 overlapping the projection PP in the Y direction.

Consequently, according to the second exemplary embodiment, since the distance between the upper surface of the p⁻ type semiconductor layer 12b and the voids 25 in the Z direction after the heat treatment may be lengthened, the yield at the time of manufacturing the semiconductor device may be further improved.

The relative level of the impurity concentration among respective semiconductor regions in the respective exemplary embodiments described above may be verified using, for example, a scanning capacitance microscope (SCM). Further, the carrier concentration in the respective semiconductor regions may be regarded to be equivalent to the impurity concentration activated in the respective semiconductor regions. Accordingly, the relative level of the carrier concentration among the respective semiconductor regions may be verified using the SCM.

Moreover, the impurity concentration of the respective semiconductor regions may be measured using secondary ion mass spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a plurality of first semiconductor regions of a first conductivity type spaced apart along a first direction and extending in a second direction intersecting the first direction;
   a plurality of second semiconductor regions of a second conductivity type extending in the second direction, each second semiconductor region being between adjacent first semiconductor regions along the first direction, at least one second semiconductor region including a void having at least one outer surface having a crystal plane orientation of (100);
   a third semiconductor region of the second conductivity type on each second semiconductor region;
   a fourth semiconductor region of the first conductivity type on the third semiconductor region; and
   a gate electrode on each first semiconductor region and adjacent to the third semiconductor region via a gate insulation layer, wherein the at least one second semiconductor region including the void includes a first portion and a second portion that is between the first portion and the first semiconductor region, the second portion having a carrier concentration of the second conductivity type that is higher than a carrier concentration of the second conductivity type in the first portion.

2. The semiconductor device according to claim 1, wherein the at least one second semiconductor region including the void has a first surface intersecting the first direction and a second surface intersecting a third direction perpendicular to the first direction and the second direction, and a crystal plane orientation of the first surface and a crystal plane orientation of the second surface are each (100).

3. The semiconductor device according to claim 1, wherein the void is within the first portion.

4. The semiconductor device according to claim 1, wherein the void is in the first portion and extends through the second portion in a third direction orthogonal to the first and second directions.

5. The semiconductor device according to claim 1, wherein the void extends in the second direction.

6. The semiconductor device according to claim 1, further comprising:
   a fifth semiconductor region of the second conductivity type on the third semiconductor region, wherein
   a carrier concentration of the second conductivity type in the fifth semiconductor region is higher than a carrier concentration of the second conductivity type in the third semiconductor region, and
   at least a part of the fifth semiconductor region is aligned with at least a portion of the void along a third direction that is orthogonal to the first and second directions.

7. The semiconductor device according to claim 6, wherein the fifth semiconductor region is thicker than the fourth semiconductor region in the third direction.

8. The semiconductor device according to claim 1, wherein
   a portion of an upper surface of the third semiconductor region is at a first distance from a lower surface of the third semiconductor region along a third direction,
   a portion of an upper surface of the fourth semiconductor layer is at a second distance from the lower surface of the third semiconductor region along the third direction, and
   the first distance is greater than the second distance.

9. The semiconductor device according to claim 1, wherein each outer surface of the void has a crystal plane orientation of (100).

10. A semiconductor device, comprising:
- a plurality of first semiconductor regions of a first conductivity type spaced apart along a first direction and extending in a second direction intersecting the first direction;
- a plurality of second semiconductor regions of a second conductivity type extending in the second direction, each second semiconductor region being between adjacent first semiconductor regions along the first direction, at least one second semiconductor region including a void;
- a third semiconductor region of the second conductivity type on each second semiconductor region;
- a fourth semiconductor region of the first conductivity type on the third semiconductor region; and
- a gate electrode on each first semiconductor region and adjacent to the third semiconductor region via a gate insulation layer, wherein each outer surface of the void formed by the at least one second semiconductor region has a crystal plane orientation of (100).

11. The semiconductor device according to claim 10, wherein the at least one second semiconductor region including the void includes a first portion and a second portion that is between the first portion and the first semiconductor region, the second portion having a carrier concentration of the second conductivity type that is higher than a carrier concentration of the second conductivity type in the first portion.

12. The semiconductor device according to claim 11, wherein the void is within the first portion.

13. The semiconductor device according to claim 11, wherein the void is in the first portion and extends through the second portion in a third direction orthogonal to the first and second directions.

14. The semiconductor device according to claim 10, wherein the void extends in the second direction.

15. The semiconductor device according to claim 10, further comprising:
- a fifth semiconductor region of the second conductivity type on the third semiconductor region, wherein
- a carrier concentration of the second conductivity type in the fifth semiconductor region is higher than a carrier concentration of the second conductivity type in the third semiconductor region, and
- at least a part of the fifth semiconductor region is aligned with at least a portion of the void along a third direction that is orthogonal to the first and second directions.

16. The semiconductor device according to claim 15, wherein the fifth semiconductor region is thicker than the fourth semiconductor region in the third direction.

17. The semiconductor device according to claim 10, wherein
- a portion of an upper surface of the third semiconductor region is at a first distance from a lower surface of the third semiconductor region along a third direction,
- a portion of an upper surface of the fourth semiconductor layer is at a second distance from the lower surface of the third semiconductor region along the third direction, and
- the first distance is greater than the second distance.

* * * * *